(12) United States Patent
Monden et al.

(10) Patent No.: US 8,852,389 B2
(45) Date of Patent: Oct. 7, 2014

(54) PLASMA PROCESSING APPARATUS AND PLASMA PROCESSING METHOD

(75) Inventors: Taichi Monden, Yamanashi (JP); Junichi Kitagawa, Yamanashi (JP); Jun Yamashita, Yamanashi (JP); Hideo Nakamura, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 323 days.

(21) Appl. No.: 13/233,082

(22) Filed: Sep. 15, 2011

(65) Prior Publication Data

US 2012/0067845 A1 Mar. 22, 2012

(30) Foreign Application Priority Data

Sep. 16, 2010 (JP) .................... 2010-207772
Jul. 26, 2011 (JP) .................... 2011-163750

(51) Int. Cl.
*C23C 16/00* (2006.01)
*C23F 1/00* (2006.01)
*H01L 21/306* (2006.01)
*H01J 37/32* (2006.01)

(52) U.S. Cl.
CPC ............................ *H01J 37/32192* (2013.01)
USPC ............ 156/345.41; 156/345.35; 156/345.36; 118/723 MW; 118/723 ME

(58) Field of Classification Search
CPC ............ H01J 37/32214; H01J 37/3225; H01J 37/32232; H01J 37/32258; H01J 37/32375; H01J 37/32238; H01J 37/32211; H01J 37/3222; H01J 37/32192; C23C 16/511; C23C 16/452; C23C 16/455

USPC .................... 156/345.35, 345.36, 345.41; 118/723 MW, 723 ME

See application file for complete search history.

(56) References Cited

U.S. PATENT DOCUMENTS

| | | | | |
|---|---|---|---|---|
| 5,951,887 A | * | 9/1999 | Mabuchi et al. | 219/121.43 |
| 6,646,224 B2 | * | 11/2003 | Goto et al. | 219/121.43 |
| 6,797,111 B2 | * | 9/2004 | Hongoh et al. | 156/345.41 |
| 2003/0029567 A1 | * | 2/2003 | Dhindsa et al. | 156/345.47 |
| 2007/0264441 A1 | * | 11/2007 | Ishibashi et al. | 427/488 |
| 2011/0024048 A1 | * | 2/2011 | Nakamura et al. | 156/345.51 |

FOREIGN PATENT DOCUMENTS

| | | | |
|---|---|---|---|
| JP | 09-266095 A | 10/1997 | |
| JP | 10-214823 A | 8/1998 | |
| WO | 2009/123198 A1 | 10/2009 | |
| WO | WO 2009/123198 | * 10/2009 | ............ H01L 21/306 |

* cited by examiner

*Primary Examiner* — Rakesh Dhingra
(74) *Attorney, Agent, or Firm* — Pearne & Gordon LLP

(57) ABSTRACT

There is provided a plasma processing apparatus capable of stably generating plasma by suppressing oscillation of a plasma potential, and capable of preventing contamination caused by sputtering a facing electrode made of metal. A high frequency bias power is applied to an electrode within a mounting table for mounting a target object thereon. An extended protrusion 60 is formed at an inner peripheral surface of a cover member 27. The extended protrusion 60 is formed toward a plasma generation space S and serves as a facing electrode facing an electrode 7 within a mounting table 5 with the plasma generation space S therebetween. A ratio of a surface area of the facing electrode with respect to that of an electrode for bias (facing electrode surface area/bias electrode area) is in a range of from about 1 to about 5.

15 Claims, 14 Drawing Sheets

PLASMA PROCESSING APPARATUS AND PLASMA PROCESSING METHOD

CROSS-REFERENCE TO RELATED APPLICATION

This application claims the benefit of Japanese Patent Application Nos. 2010-207772 and 2011-163750 filed on Sep. 16, 2010 and Jul. 26, 2011, respectively, the entire disclosures of which are incorporated herein by reference.

FIELD OF THE INVENTION

The present disclosure relates to a plasma processing apparatus and a plasma processing method for performing a plasma process on a target object such as a semiconductor wafer.

BACKGROUND OF THE INVENTION

In a manufacturing process of a semiconductor device, various processes such as an etching process, an ashing process and a film forming process have been performed on a semiconductor wafer as a target object. In these processes, there has been used a plasma processing apparatus configured to perform a plasma process on the semiconductor wafer in a processing chamber capable of maintaining a vacuum atmosphere.

Recently, a semiconductor wafer has become larger and a device has become miniaturized. In response to this trend, it has been required to enhance efficiency (for example, a film forming rate) in a plasma process and uniformity of a process on a wafer surface. For this reason, attention is drawn to a method for performing a plasma process while a bias voltage is applied to a semiconductor wafer and a high frequency power is applied to an electrode embedded in a mounting table for mounting thereon a semiconductor wafer within a processing chamber of a plasma processing apparatus (for example, Patent Document 1).

If the high frequency power is applied to the electrode embedded in the mounting table, a conductive member, having a ground potential, positioned over a plasma generation space with respect to the electrode embedded in the mounting table may serve as a facing electrode. That is, if the high frequency bias power is applied to the electrode within the mounting table, there is formed a path of a high frequency current (a RF return circuit) from this mounting table to the facing electrode via plasma and from the facing electrode to an earth of a high frequency bias power supply via a wall of the processing chamber. If the path of the high frequency current is not formed stably, an oscillation amplitude of a plasma potential (Vp) generated within the processing chamber becomes large, and, thus, the plasma process cannot be performed stably. Further, if the oscillation amplitude of the plasma potential is large, particularly when a process is performed at a low pressure of several tens Pa or less, a surface of the facing electrode typically made of aluminum may be sputtered by the plasma, resulting in contamination. In order to suppress oscillation of the plasma potential, the facing electrode needs to have a sufficiently large area. However, in a conventional microwave plasma processing apparatus described in Patent Document 1, a microwave transmissive plate is provided at an upper region of the processing chamber. Thus, unlike a parallel plate type plasma processing apparatus, it is difficult for the facing electrode to have a sufficiently large area due to a design limitation of the apparatus.

In this regard, as a microwave plasma processing apparatus, there has been suggested a plasma processing apparatus capable of detachably attaching an annular facing electrode made of silicon or aluminum to a periphery of a microwave transmissive plate within a processing chamber (for example, Patent Documents 2 and 3). In a conventional technique described in Patent Documents 2 and 3, the facing electrode has a sufficiently large area. Thus, when a high frequency power is applied to a mounting table, a plasma potential (Vp) can be stabilized. However, since the facing electrode described in Patent Documents 2 and 3 is provided so as to closely come into contact with the microwave transmissive plate, an effective area for introducing a microwave becomes smaller and the microwave is introduced unstably. Thus, plasma may be generated unstably in the processing chamber. Further, in the microwave plasma processing apparatus, plasma is generated right below the microwave transmissive plate, and, thus, a temperature of electrons is the highest in the vicinity of the microwave transmissive plate. For this reason, if the facing electrode closely comes into contact with the microwave transmissive plate so as to protrude toward a processing space as described in Patent Documents 2 and 3, a front end of the facing electrode can be sputtered by the plasma easily and contamination may occur.

Patent Document 1: PCT Publication No. WO2009/123198 A1
Patent Document 2: Japanese Patent Laid-open Publication No. H09-266095
Patent Document 3: Japanese Patent Laid-open Publication No. H10-214823

BRIEF SUMMARY OF THE INVENTION

In view of the foregoing circumstance, the present disclosure provides a plasma processing method capable of stably generating plasma by suppressing oscillation of a plasma potential, and capable of preventing contamination caused by sputtering on a facing electrode made of metal in a plasma processing apparatus configured to apply a high frequency bias power to the electrode within a mounting table for mounting a target object thereon.

In accordance with one aspect of the present disclosure, there is provided a plasma processing apparatus including a processing chamber having an opening at an upper portion thereof and configured to perform therein a process on a target object by plasma; a mounting table configured to mount the target object thereon within the processing chamber; a first electrode embedded in the mounting table and configured to apply a bias voltage to the target object; a dielectric plate configured to form a plasma generation space by closing the opening of the processing chamber and transmit a microwave so as to introduce the microwave into the processing chamber; a planar antenna provided above the dielectric plate and configured to introduce the microwave generated by a microwave generator into the processing chamber via the dielectric plate; an annular cover member provided on the processing chamber and including a contact support protruding toward the plasma generation space and configured to support an outer periphery of the dielectric plate on an upper surface of the contact support; an annular extended protrusion protruding from the processing chamber or the contact support toward the plasma generation space within the processing chamber with a gap between the dielectric plate and the annular extended protrusion and serving as a part of a second electrode facing the first electrode via the plasma generation space therebetween; and a space formed between an upper surface of the extended protrusion and a lower surface of the dielectric plate.

In the plasma processing apparatus, a gap between the upper surface of the extended protrusion and the lower surface of the dielectric plate may be in a range of from about 10 mm to about 30 mm.

In the plasma processing apparatus, a leading end of the extended protrusion may have a protruded length that does not reach an area above an edge of the target object mounted on the mounting table.

The plasma processing apparatus may further include a gas inlet for introducing a processing gas into the space between the dielectric plate and the extended protrusion.

In the plasma processing apparatus, the extended protrusion may be formed as a single body with the cover member. Alternatively, the extended protrusion may be formed as a single body with the processing chamber. Otherwise, the extended protrusion may be an auxiliary electrode member fixed to the cover member or may be an auxiliary electrode member fixed to the processing chamber.

In the plasma processing apparatus, a surface of the extended protrusion may have prominences and depressions.

In the plasma processing apparatus, a ratio of a surface area of the second electrode facing the plasma generation space to an area of an embedded range of the first electrode in the mounting table may be in a range of from about 1 to about 5.

In the plasma processing apparatus, a protective film may be formed on the surface of the extended protrusion. Here, the protective film may be made of silicon.

The plasma processing apparatus may further include an insulating plate provided along an inner wall of the processing chamber at a position lower than a mounting surface of the mounting table. Here, the insulating plate may be provided to reach an exhaust chamber connected to a lower region of the processing chamber.

In accordance with another aspect of the present disclosure, there is provided a plasma processing method for performing a process on a target object with plasma by a plasma processing apparatus including a processing chamber having an opening at an upper portion thereof and configured to perform therein the process on the target object by the plasma; a mounting table configured to mount the target object thereon within the processing chamber; a first electrode embedded in the mounting table and configured to apply a bias voltage to the target object; a dielectric plate configured to form a plasma generation space by closing the opening of the processing chamber and transmit a microwave so as to introduce the microwave into the processing chamber; a planar antenna provided above the dielectric plate and configured to introduce the microwave generated by a microwave generator into the processing chamber via the dielectric plate; an annular cover member provided on the processing chamber and including a contact support protruding toward the plasma generation space and configured to support an outer periphery of the dielectric plate on an upper surface of the contact support; an annular extended protrusion protruding from the processing chamber or the contact support toward the plasma generation space within the processing chamber with a gap between the dielectric plate and the annular extended protrusion and serving as a part of a second electrode facing the first electrode via the plasma generation space therebetween; and a space formed between an upper surface of the extended protrusion and a lower surface of the dielectric plate. The plasma processing method includes generating the plasma in the processing chamber; and performing the process on the target object with the generated plasma by the plasma processing apparatus. Here, a processing pressure may be about 40 Pa or less.

The plasma processing apparatus in accordance with the present disclosure may include the extended protrusion protruding from the processing chamber or the contact support toward the plasma generation space with the gap with respect to the dielectric plate. The extended protrusion may serve as a part of the second electrode facing the first electrode via the plasma generation space therebetween. Thus, the second electrode can have a sufficiently large area and oscillation of a plasma potential can be suppressed. Further, by increasing the second electrode surface area, it may be possible to suppress sputtering on the surface of the second electrode, and, thus, contamination can be prevented. Furthermore, since the second electrode has the sufficiently large area, a short circuit or an abnormal electric discharge in other portions can be suppressed. Moreover, since the extended protrusion may be spaced from the dielectric plate, it is not necessary to reduce an effective area of the dielectric plate, and plasma generated within the processing chamber can be stabilized by supplying the sufficient microwave power.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, embodiments of the present disclosure will be described in detail with reference to the accompanying drawings.

First Embodiment

Figure 1:
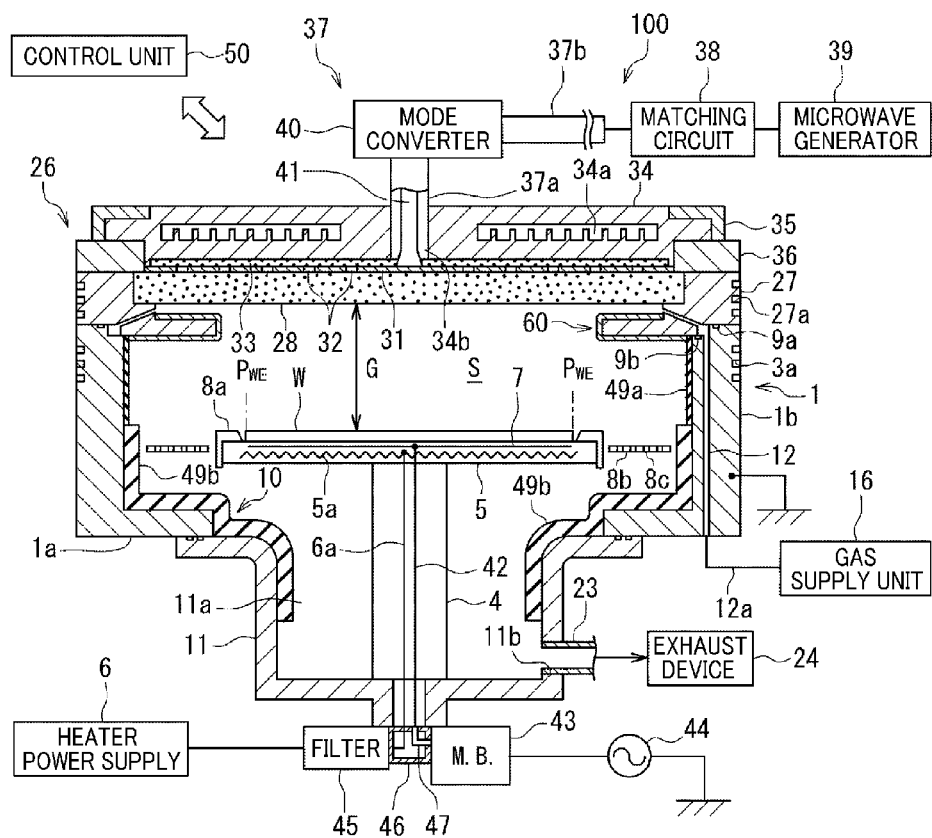
FIG. 1 is a schematic cross sectional view of a plasma processing apparatus in accordance with a first embodiment of the present disclosure.
Figure 2A:
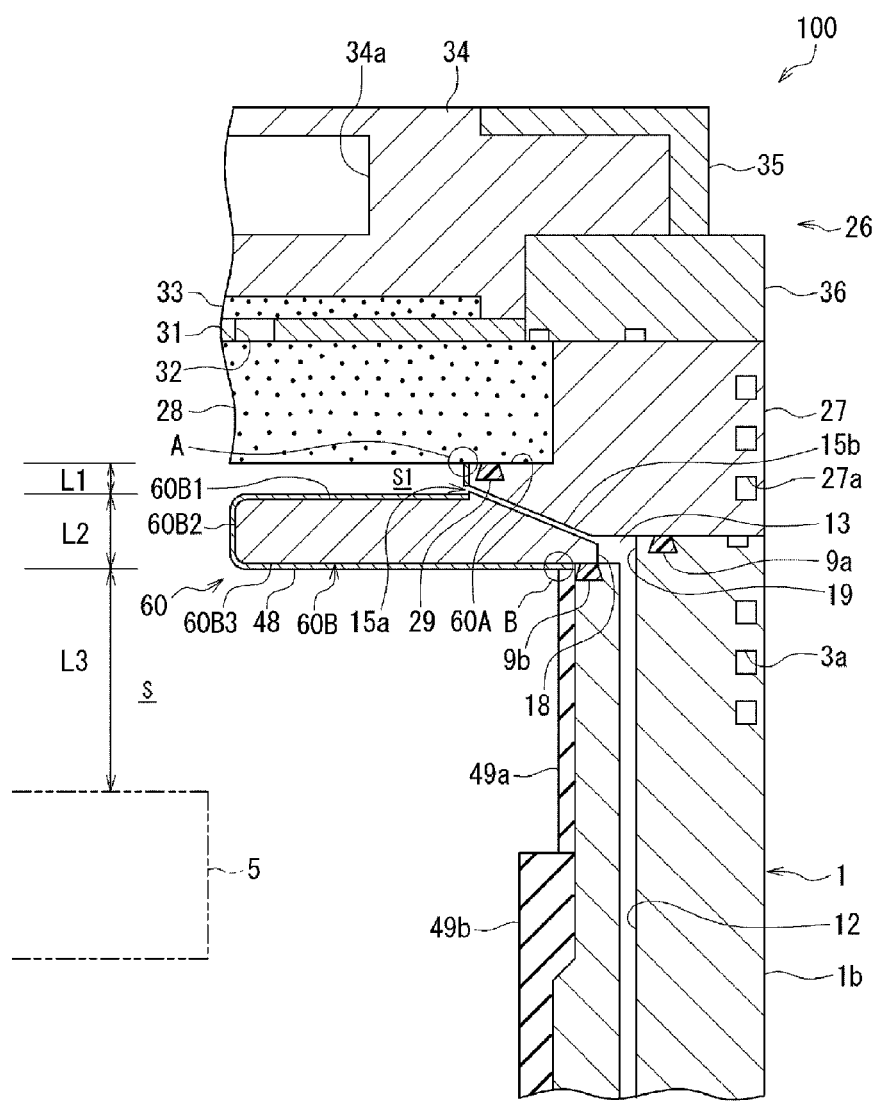
FIG. 2A is a cross sectional view showing enlarged main parts of FIG. 1.
Figure 2B:
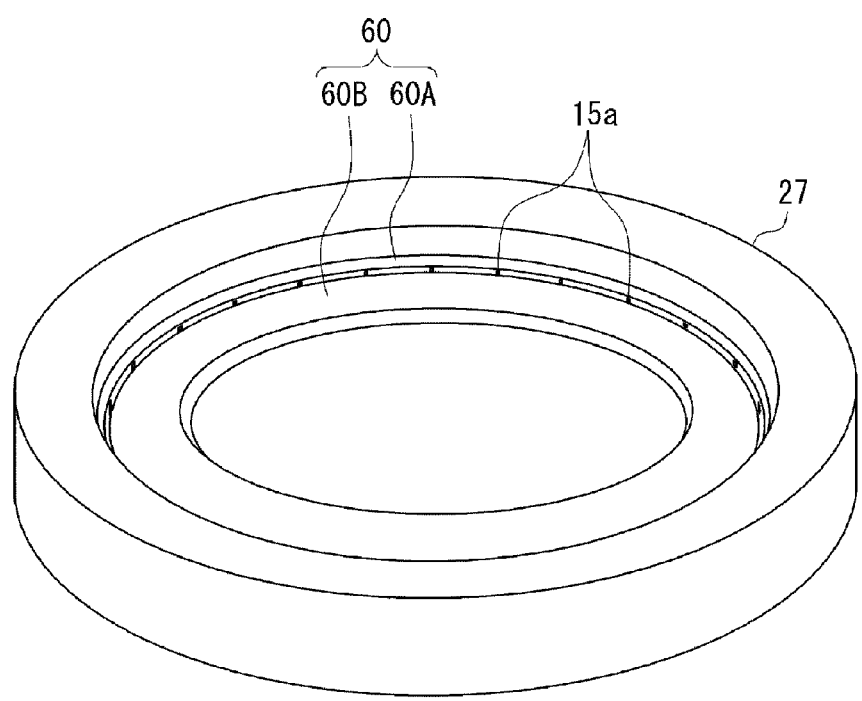
FIG. 2B is a perspective view showing an external appearance of a cover.
Figure 3A:
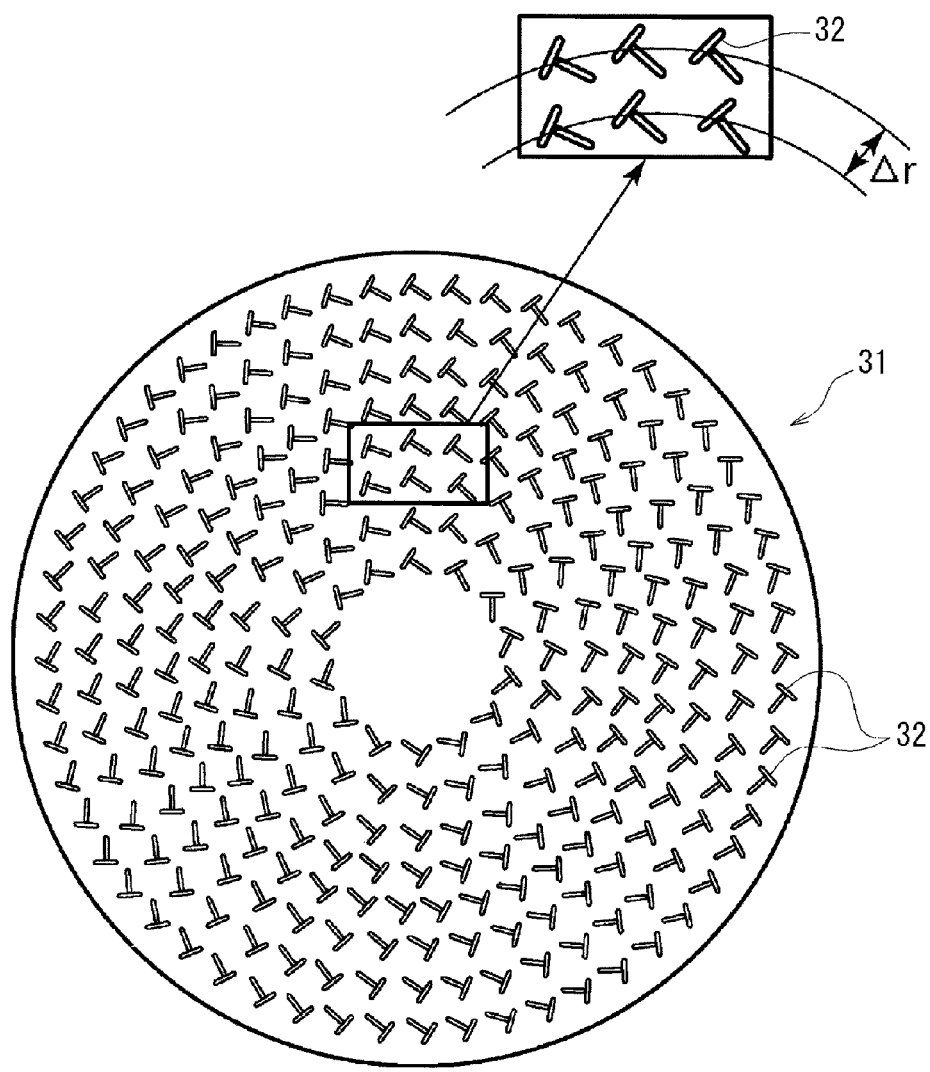
FIG. 3A shows a configuration of a planar antenna.

FIG. 1 is a schematic cross sectional view showing a configuration of a plasma processing apparatus 100 in accordance with a first embodiment of the present disclosure. FIG. 2A is a cross sectional view showing enlarged main parts of FIG. 1. FIG. 2B is a perspective view showing an external appearance of a cover as a component of the plasma processing apparatus 100. FIG. 3A shows a planar antenna of the plasma processing apparatus 100 of FIG. 1.

The plasma processing apparatus 100 may be configured as a RLSA microwave plasma processing apparatus capable of generating microwave excitation plasma having a high density and a low electron temperature within the processing chamber by introducing a microwave into a processing chamber through a planar antenna having multiple slot holes, particularly a RLSA (Radial Line Slot Antenna). In the plasma processing apparatus 100, a process can be performed by plasma having a plasma density in a range of from about $1 \times 10^{10}/cm^3$ to about $5 \times 10^{12}/cm^3$, and a low electron temperature in a range of from about 0.7 eV to about 2 eV. Thus, by way of example, in manufacturing processes of various semiconductor devices, the plasma processing apparatus 100 can be used appropriately for forming a silicon oxide film (for example, a $SiO_2$ film) by oxidizing silicon of a target object or forming a silicon nitride film (for example, a SiN film) by nitriding the silicon of a target object.

The plasma processing apparatus 100 may be sealed airtightly and may include a substantially cylindrical processing chamber 1 configured to accommodate therein a semiconductor wafer (hereinafter, simply referred to as "wafer") W as a target object. This processing chamber 1 may be grounded and made of a metal such as aluminum, aluminum alloy or stainless steel. Further, the processing chamber 1 may be configured to be divided into multiple sections instead of being a single chamber. At an upper region of the processing chamber 1, a microwave inlet unit 26 may be provided so as to be opened and closed. That is, the microwave inlet unit 26 may be positioned at an upper end portion of the processing chamber 1. Further, at a lower region of the processing chamber 1, an exhaust chamber 11 may be connected. The processing chamber 1 may include a multiple number of cooling water paths 3a configured to cool a wall of the processing chamber 1. Thus, it is possible to suppress plasma damage or a position deviation of a contact surface with the microwave inlet unit 26 by thermal expansion caused by a plasma heat, and also prevent a decrease in a sealing property or particle generation.

Within the processing chamber 1, a mounting table 5 configured to horizontally support the wafer W may be provided. The mounting table 5 may be supported by a cylindrical support 4 extended upwards from a central bottom portion of the exhaust chamber 11. The mounting table 5 and the support 4 may be made of, for example, quartz or a ceramic material such as AlN or $Al_2O_3$ and, particularly, AlN of high thermal conductivity may be desirable. Further, the mounting table 5 may have therein a resistance heater 5a. By way of example, since the resistance heater 5a may be supplied with a power from a heater power supply 6 as an AC power supply of about 200 V and may heat the mounting table 5, the wafer W as the target object may be heated accordingly. At a power supply line 6a configured to connect the heater 5a and the heater power supply 6, a filter box 45 configured to filter a RF (a high frequency) power may be provided. A temperature of the mounting table 5 may be measured by a non-illustrated thermocouple that is embedded in the mounting table 5. Further, based on a signal from the thermocouple, the heater power supply 6 may be controlled. By way of example, the temperature can be stably controlled in a range of from room temperature to about 800° C.

Within the mounting table 5, a bias electrode 7 serving as a first electrode may be embedded above the heater 5a. This electrode 7 may be embedded in a region approximately corresponding to the wafer W mounted on the mounting table 5. The electrode 7 may be made of a conductive material such as molybdenum and tungsten. The electrode 7 may be formed in, for example, a mesh shape, a grid pattern or a vortex shape. A cover 8a may be provided so as to cover the upper surface and the entire surface of a sidewall of the mounting table 5. The cover 8a may prevent the mounting table 5 sputtered by plasma from being a cause of metal contamination. In an upper surface of the cover 8a, a recess (a groove) having a size larger than a size of the wafer W and a depth substantially equivalent to a thickness of the wafer W may be formed in order to guide the wafer W. The wafer W may be positioned on this recess. Around the mounting table 5, a baffle plate 8b made of quartz may be provided annularly in order to uniformly exhaust the inside of the processing chamber 1. This baffle plate 8b may have a plurality of holes 8c and may be supported by a supporting column (not illustrated). In the mounting table 5, a multiple number of wafer supporting pins (not illustrated) configured to support and lift up/down the wafer W may be provided so as to protrude from and retract into the upper surface of the mounting table 5.

At a substantially central portion in a bottom wall 1a of the processing chamber 1, a circular opening 10 may be formed. At the bottom wall 1a, the exhaust chamber 11 extending downwards may be provided. The exhaust chamber 11 may communicate with the opening 10 and uniformly exhaust the inside of the processing chamber 1. At a side wall of the exhaust chamber 11, an exhaust port 11b may be formed, and an exhaust line 23 may be connected thereto. This exhaust line 23 may be connected to an exhaust device 24 including a vacuum pump. By operating this exhaust device 24, an internal gas of the processing chamber 1 may be uniformly discharged into a space 11a of the exhaust chamber 11 and exhausted through the exhaust line 23. Thus, the inside of the processing chamber 1 can be quickly depressurized to a certain vacuum level, for example, about 0.133 Pa. The exhaust line 23 may be connected to a bottom surface of the exhaust chamber 11. Further, the exhaust chamber 11 may be provided within the processing chamber 1.

At a sidewall 1b of the processing chamber 1, a loading/unloading port configured to load and unload the wafer W and a gate valve configured to open and close this loading/unloading port may be provided (all not illustrated).

At an upper region of the processing chamber 1, an opening may be formed, and the microwave inlet unit 26 may be provided airtightly so as to cover this opening. This microwave inlet unit 26 can be opened and closed by a non-illustrated opening/closing device. The microwave inlet unit 26 may include, as main components, a cover member 27, a microwave transmissive plate 28, a planar antenna 31, a wavelength shortening member 33 in sequence upwardly from the mounting table 5. Further, a conductive cover 34 made of, for example, SUS, aluminum, and aluminum alloy may be provided so as to cover the wavelength shortening member 33. An outer periphery of the cover 34 may be fixed to the cover member 27 by an annular pressing ring 35 via a fixing member 36.

The cover member 27 may be grounded and made of the same material as the processing chamber 1. In the present embodiment, an opening may be formed at the annular cover member 27. An inner periphery of the cover member 27 may be exposed to a plasma generation space S within the processing chamber 1, and the cover member 27 may serve as a facing electrode (a second electrode) facing the electrode 7 (a lower electrode) within the mounting table 5. An inner peripheral surface of the annular cover member 27 may be provided with a protrusion 60 protruding toward the plasma generation space S rather than an inner wall surface of the processing chamber 1. As depicted in FIGS. 2A and 2B, the protrusion 60 may include a contact support 60A and an extended protrusion 60B. Here, the contact support 60A may contact with the microwave transmissive plate 28 thereon and support the microwave transmissive plate 28. Further, the extended protrusion 60B may be configured to outstandingly protrude toward the plasma generation space S within the processing chamber 1 rather than the contact support 60A. Since a step-shaped portion may be formed between the contact support 60A and the extended protrusion 60B, when the microwave transmissive plate 28 is positioned on the contact support 60A, an annular space S1 may be formed between the microwave transmissive plate 28 and the extended protrusion 60B. In the present embodiment, the extended protrusion 60B may play a major role in the facing electrode. Further, the space S1 may constitute a portion of the plasma generation space S.

In an inner peripheral surface of the contact support 60A of the cover member 27, gas inlet openings 15a may be formed uniformly at multiple positions (for example, about 32 positions). That is, at a wall of the contact support 60A where the step-shaped portion is formed between the contact support 60A and the extended protrusion 60B, the multiple gas inlet openings 15a may be annularly formed. Each gas inlet opening 15a may be opened toward the space S1 so as to respectively introduce a processing gas into the space S1. Each of gas inlet paths 15b extended in a slated direction from each gas inlet opening 15a into the cover member 27 may be formed. Alternatively, the gas inlet path 15b may be formed horizontally. Each gas inlet path 15b may communicate with an annular path 13 horizontally formed between the cover member 27 and the upper portion of the processing chamber 1. Thus, the processing gas can be supplied uniformly into the plasma generation space S and the space S1 within the processing chamber 1.

At a contact portion between the processing chamber 1 and the cover member 27, sealing members 9a and 9b such as O-ring may be provided along the annular path 13 at the inside and the outside with respect to the annular path 13. Thus, the contact portion may be airtightly maintained. That is, when the microwave inlet unit 26 is closed, a space between an upper end surface of the sidewall 1b of the processing chamber 1 and the cover member 27 having an opening/closing function may be sealed by the sealing members 9a and 9b. The sealing members 9a and 9b may be made of fluorine-based rubber material, for example, Kalrez (trade name; product of DuPont). Further, at an outer peripheral surface of the cover member 27, a multiple number of coolant paths 27a may be formed. The cover member 27 and an outer peripheral portion of the microwave transmissive plate 28 may be cooled by a coolant circulating through the coolant path 27a. Thus, it is possible to prevent a position deviation of a contact surface between the cover member 27 and the microwave transmissive plate 28 due to thermal expansion caused by a plasma heat. Further, it is also possible to prevent a sealing property from being decreased or particles from being generated.

The microwave transmissive plate 28 as a dielectric plate may be made of a dielectric material such as quartz or ceramic such as $Al_2O_3$, AlN, sapphire and SiN. The microwave transmissive plate 28 may serve as a microwave inlet window for transmitting a microwave from the planar antenna 31 and introducing the transmitted microwave into the plasma generation space S within the processing chamber 1. A lower surface (facing the mounting table 5) of the microwave transmissive plate 28 may be not limited to a planar surface, and a recess or a groove may be formed thereon in order to make a microwave uniform and stabilize plasma, for example.

The outer peripheral portion of the microwave transmissive plate 28 may be airtightly supported on the contact support 60A of the protrusion 60 of the cover member 27 via a sealing member 29. Therefore, while the microwave inlet unit 26 is closed, the plasma generation space S may be formed by the processing chamber 1 and the microwave transmissive plate 28, and the plasma generation space S may be maintained airtightly.

The planar antenna 31 may be formed in a circular plate shape and engaged with an outer periphery of the cover 34 above the microwave transmissive plate 28. The planar antenna 31 may have a surface formed of a metal plate such as a gold- or silver-plated copper plate, an aluminum plate, a nickel plate or a brass plate and may have multiple slot holes 32 for radiating an electromagnetic wave such as a microwave. The slot holes 32 may pass through the planar antenna 31 and every two adjacent slot holes may make a pair and be arranged in a certain pattern.

By way of example, each of the slot holes 32 may be formed in an elongated groove shape as depicted in FIG. 3A, and, typically, adjacent two slot holes 32 may be arranged in a "T" shape. Further, these multiple slot holes 32 may be arranged concentrically. A length or arrangement gap of the slot holes 32 may be determined depending on a wavelength λg of a microwave within a waveguide 37. By way of example, the slot holes 32 may be arranged such that a gap therebetween is set to be in a range of from about λg/4 to about λg. Further, in FIG. 3A, a gap between two pairs of the slot holes 32 arranged concentrically may be represented as Δr. Further, the slot holes 32 may have other shapes such as a circular shape or a circular arc shape. Furthermore, an arrangement shape of the slot holes is not specifically limited to a concentric circular shape, and, thus, the slot holes 32 may be arranged in, for example, a spiral shape or a radial shape.

The wavelength shortening member 33 may have a dielectric constant higher than that of a vacuum, and may be provided on an upper surface of the planar antenna 31. The wavelength shortening member 33 may be made of quartz, ceramic, fluorine-based resin such as polytetrafluoroethylene, or polyimide resin. Since a wavelength of a microwave is increased in a vacuum state, the wavelength shortening member 33 may control plasma by shortening the wavelength of the microwave. Further, the planar antenna 31 may be closely contacted with or spaced apart from the microwave transmissive plate 28. Moreover, the planar antenna 31 may be closely contacted with or spaced apart from the wavelength shortening member 33. However, it is desirable that the planar antenna 31 may be closely brought into contact with the microwave transmissive plate 28 and the wavelength shortening member 33.

Within the cover 34, a coolant path 34a may be formed and a coolant may flow through the coolant path 34a so as to cool the cover 34, the wavelength shortening member 33, the planar antenna 31, the microwave transmissive plate 28 and the cover member 27. Therefore, it may be possible to prevent these components from being deformed or damaged, and also possible to generate stable plasma. The planar antenna 31 and the cover 34 may be grounded.

At a central portion of the cover 34, an opening 34b may be formed, and the opening 34b may be connected to the waveguide 37. An end of the waveguide 37 may be connected to a microwave generator 39 via a matching circuit 38. Thus, a microwave having a frequency of, for example, about 2.45 GHz generated by the microwave generator 39 may be propagated to the planar antenna 31 through the waveguide 37. As a frequency of the microwave, about 8.35 GHz or about 1.98 GHz may be employed.

The waveguide 37 may include a coaxial waveguide 37a having a cylindrical cross-sectional shape and a rectangular waveguide 37b connected to the coaxial waveguide 37a at an upper end of the coaxial waveguide 37a via a mode converter 40. The coaxial waveguide 37a may be extended upwards from the opening 34b of the cover 34, and the rectangular waveguide 37b may be extended horizontally. The mode converter 40 between the coaxial waveguide 37a and the rectangular waveguide 37b may convert a microwave propagated in a TE mode within the rectangular waveguide 37b into a TEM mode. In a center of the coaxial waveguide 37a, an internal conductor 41 may be extended from the mode converter 40 to the planar antenna 31. A lower end of the internal conductor 41 may be connected and fixed to a central portion of the planar antenna 31. Further, a flat waveguide may be formed by the planar antenna 31 and the cover 34. Thus, the microwave may be introduced into the central portion of the planar antenna 31 via the internal conductor 41 of the coaxial waveguide 37a, and then, the introduced microwave may be efficiently and uniformly propagated from the central portion of the planar antenna 31 in a radial direction.

Hereinafter, a gas supply mechanism of the plasma processing apparatus 100 will be explained. As depicted in FIG. 2A, at certain positions (for example, equi-spaced four positions) of the sidewall 1b of the processing chamber 1, multiple gas supply channels 12 vertically penetrating an inside of the sidewall 1b and the bottom wall 1a may be formed. Each gas supply channel 12 may be connected to the annular path 13 formed at a contact surface between an upper end of the sidewall 1b of the processing chamber 1 and a lower end of the cover member 27. The annular path 13 may be connected to a gas supply unit 16 via the gas supply channel 12 and a gas supply pipe 12a. Alternatively, the gas supply unit 16 may be connected to the annular path 13 at a side surface of the processing chamber 1 by horizontally forming the gas supply channel 12.

The annular path 13 is a gas path formed by a step-shaped portion 18 and a step-shaped portion 19 at a contact portion between an upper end surface of the processing chamber 1 and a lower end surface of the cover member 27. The step-shaped portion 18 may be positioned at a lower surface of the cover member 27, and the step-shaped portion 19 may be positioned at an upper end surface of the sidewall 1b of the processing chamber 1. This annular path 13 may be provided annularly in a substantially horizontal direction so as to surround the plasma generation space S within the processing chamber 1. Alternatively, the annular path 13 may be provided by forming a groove (a recess) in the upper end surface of the sidewall 1b of the processing chamber 1 or in the lower surface of the cover member 27. The annular path 13 may serve as a gas distribution unit capable of uniformly distributing and supplying a gas to each gas inlet path 15b. That is, the annular path 13 may prevent the processing gas from being non-uniformly supplied into the processing chamber 1 by being supplied only to specific gas inlet openings 15a. As described above, in the present embodiment, the processing gas from the gas supply unit 16 may be supplied uniformly into the plasma generation space S and the space S1 within the processing chamber 1 from the gas inlet openings 15a through each gas supply channel 12, the annular path 13 and each gas inlet path 15b. For example, the gas inlet openings 15a are provided at about thirty two (32) positions. Therefore, it may be possible to enhance uniformity of the plasma within the processing chamber 1.

Hereinafter, there will be explained a bias voltage applying unit configured to apply a bias voltage to the wafer W mounted on the mounting table 5. The electrode 7 embedded in the mounting table 5 may be connected to a high frequency power supply 44 for applying a bias power via a power supply line 42 penetrating the inside of the support 4 and a matching box (M.B.) 43. The electrode 7 may be configured to apply a high frequency bias power to the wafer W. As described above, the filter box 45 may be provided at the power supply line 6a for supplying a power from the heater power supply 6 to the heater 5a. The matching box 43 and the filter box 45 may be connected with each other via a shield box 46 and may be positioned at a lower portion of the exhaust chamber 11. The shield box 46 may be made of a conductive material such as aluminum and SUS. Within the shield box 46, a conductive plate 47 made of, e.g., copper and connected to the power supply line 42 may be provided. Further, the conductive plate 47 may be connected to a matcher (not illustrated) within the matching box 43. By using the conductive plate 47, a contact area with respect to the power supply line 42 may be greatly increased and a contact resistance may be decreased. As a result, it is possible to reduce an electric current loss at the contact portion. As described above, in the plasma processing apparatus 100 in accordance with the present embodiment, the matching box 43 and the filter box 45 may be connected with each other via the shield box 46 as a unit and directly connected to the lower portion of the exhaust chamber 11 of the processing chamber 1. Thus, it may be possible to reduce a loss of the high frequency power supplied to the electrode 7 from the high frequency power supply 44, and also possible increase power consumption efficiency. Accordingly, power can be supplied stably. Since the high frequency bias power can be applied stably to the wafer W mounted on the mounting table 5, the plasma generated within the processing chamber 1 may be stabilized and a uniform plasma process can be performed.

As described above, at the inner peripheral surface of the cover member 27, the protrusion 60 including the contact support 60A and the extended protrusion 60B may constitute a part of the cover member 27. Since the cover member 27 and the protrusion 60 are formed as a single body, thermal conductivity and electric conductivity can be secured. The extended protrusion 60B of the protrusion 60 may include an upper surface 60B1, a leading end surface 60B2, and a lower surface 60B3. This protrusion 60 may be formed toward the plasma generation space S and may serve as the facing electrode (second electrode) facing the electrode (first electrode) within the mounting table 5 with the plasma generation space S therebetween. To be specific, in FIG. 2A, a surface ranging from a position A indicated by a circle to a position B indicated by a circle and including an exposed surface of the protrusion 60 (i.e. a surface of the contact support 60A and the upper surface 60B1, the leading end surface 60B2, and the lower surface 60B3 of the extended protrusion 60B) may serve as the facing electrode. Here, the position A is an end of a contact portion between the contact support 60A of the cover member 27 and the microwave transmissive plate 28. Further, the position B is an end (i.e., an end contacted with an upper liner 49a) of an exposed lower surface of the contact support 60A. In the present embodiment, the inner peripheral surface of the annular cover member 27 ranging from the position A to the position B may be exposed to the plasma generation space S and may serve as the facing electrode of an annular shape. In this way, by providing an annular member serving as a facing electrode so as to protrude toward the plasma generation space, even in the RLSA-type plasma processing apparatus 100 in which it is difficult to provide a facing electrode right above the mounting table 5 due to the microwave transmissive plate 28, the facing electrode may have a sufficiently large surface area.

Figure 3B:
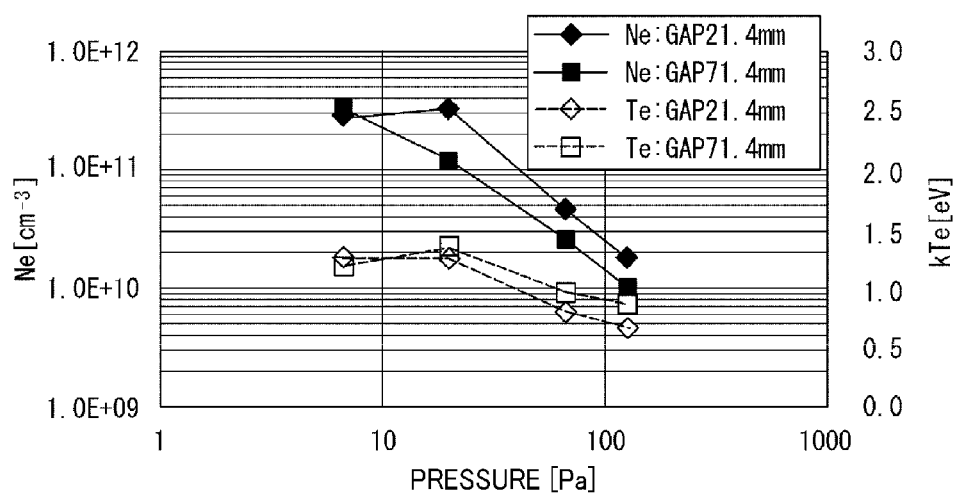
FIG. 3B is a graph showing a measurement result of an electron density and an electron temperature within a processing chamber with respect to different pressures and gaps.

In the plasma processing apparatus 100 in accordance with the present embodiment, the portion serving as the facing electrode facing the lower electrode may be exposed to the plasma generation space S and may be a conductive member having a ground potential. Further, as will be described below, since a protective film 48 can be formed on the surface of the facing electrode, "the portion exposed to the plasma generation space S" may include the portion on which the protective film 48 is formed. To define the facing electrode in more detail, by way of example, the facing electrode may have a surface, above a wafer mounting surface of the mounting table 5, exposed toward the plasma generation space S. Further, the facing electrode may be a conductive member exposed to plasma having an electron density of about $1\times10^{11}/cm^3$ or more when the plasma is generated within the processing chamber 1. However, the electron density is just an example and it is not limited thereto. By way of example, FIG. 3B shows measurement results of an electron density and an electron temperature at a region right below a central portion of the microwave transmissive plate 28 within the processing chamber 1 of the plasma processing apparatus 100 while varying a processing pressure and a gap G (a distance from a surface of the wafer W to the microwave transmissive plate 28). An electron density and an electron temperature of plasma generated within the processing chamber 1 may vary depending on the processing pressure and the gap G. Thus, it is desirable to adjust a surface area of the facing electrode depending on the processing pressure and the gap G. By way of example, the gap G may be in a range of, desirably, from about 50 mm to about 150 mm, and, more desirably, from 70 mm to about 120 mm.

Hereinafter, an area of the portion (facing electrode) exposed to the plasma generation space S may be referred to as "facing electrode surface area" and an area of an embedded range of the electrode 7 in the mounting table 5 may be referred to as "bias electrode area". Here, a ratio of the facing electrode surface area to the bias electrode area may be, desirably, about 1 or higher and, more desirably, in a range of from about 1 to about 5, and, still more desirably, in a range of from about 1 to about 4 and, still more desirably, in a range of from about 2 to about 4. If the ratio of the facing electrode surface area to the bias electrode area (facing electrode surface area/bias electrode area) is lower than about 1, oscillation of a plasma potential may be increased and stable plasma cannot be generated within the processing chamber 1. Further, a surface of the facing electrode may be etched by strong sputtering by plasma in the vicinity of the facing electrode. This may cause aluminum contamination. The ratio of the facing electrode surface area to the bias electrode area may be desirable if it is as high as possible. However, it may be desirable to set an upper limit to be about 5, or, desirably, about 4 or lower considering a size and a configuration limitation of the apparatus. When the electrode 7 has an opening or a gap formed in, for example, a mesh shape, a grid pattern and a vortex shape, the area of the embedded range of the electrode 7 in the mounting table indicates an area of an entire planar surface of the electrode 7 assuming that the entire planar surface also includes the opening or the gap formed in the electrode 7.

Desirably, a leading end (the leading end surface 60B2 of the extended protrusion 60B) of the protrusion 60 serving as the facing electrode may have a protruded length which does not reach a region above the wafer W mounted on the mounting table 5 (i.e. a position $P_{WE}$ of a peripheral end of the wafer W). If the leading end of the protrusion 60 reaches an inner position than the position $P_{WE}$ of the peripheral end of the wafer W, a range of uniform plasma having a high density, generated within the processing chamber 1, may be smaller than a size of the wafer W and a density of the plasma at a periphery of the wafer W may be decreased. As a result, there may be a possibility that a process is not uniformly performed at an outer periphery of the wafer W. At a side (on the sidewall 1b's side of the processing chamber 1) opposite to the leading end (the leading end surface 60B2) of the protrusion 60 serving as the facing electrode, a contact end with the sidewall 1b may serve as a base end. However, in the present embodiment, it may be sufficient if the position B on the way to the base end is exposed to the plasma generation space S. That is, in the present embodiment, an end of the exposed lower surface 60B3 of the protrusion 60 serving as the facing electrode may be a contact point with respect to the upper liner 49a. The contact point is indicated as the position B in FIG. 2A.

Further, the upper surface 60B1 (facing the space S1) of the extended protrusion 60B may be spaced from the lower surface of the microwave transmissive plate 28. That is, the extended protrusion 60B may protrude toward the plasma generation space S with a gap L1 with respect to the microwave transmissive plate 28. In this way, since there is the gap L1 between the microwave transmissive plate 28 and the extended protrusion 60B, the facing electrode can have a sufficiently large surface area without reducing an effective area, through which a microwave is transmitted, of the microwave transmissive plate 28. The space S1 may become a portion of the plasma generation space S and plasma may also be generated in the space S1. Thus, plasma can be maintained stably within the processing chamber 1. On the contrary, like a conventional plasma processing apparatus, if the microwave transmissive plate 28 and the extended protrusion 60B are brought into contact with each other without the gap L1 therebetween, in order for the facing electrode to have a large surface area within the processing chamber 1, a protruded amount of the extended protrusion 60B' toward the center of the microwave transmissive plate 28 needs to be increased. In this case, when plasma is generated, the effective area of the microwave transmissive plate 28 may be decreased as much as a contact area with respect to the upper surface 60B1 of the extended protrusion 60B. Therefore, a supply amount of a microwave power into the processing chamber 1 may be decreased. As a result, plasma may not be generated, or even if generated, the plasma may be unstable. In order to solve this problem, the processing chamber 1 needs to be larger, but an installation space and a manufacturing cost of the apparatus may be increased. Further, if the microwave transmissive plate 28 and the extended protrusion 60B are closely brought into contact with each other, the facing electrode's surface in a vicinity of the contact point (i.e. the leading end of the extended protrusion 60B) between the microwave transmissive plate 28 and the facing electrode may be sputtered by plasma having a high density, and, thus, metal contamination may easily occur.

The gap L1 may be, desirably, greater than a thickness of a sheath between plasma generated right below the microwave transmissive plate 28 and the microwave transmissive plate 28, and sufficiently greater than an electron mean free path. By way of example, in the plasma processing apparatus 100 depicted in FIG. 1, if a high frequency bias voltage of about 50 V is applied under a processing pressure of about 6.7 Pa, a thickness of a sheath may be about 0.25 mm and an electron mean free path may be about 8 mm. Therefore, by way of example, the gap L1 may be, desirably, in a range of from about 10 mm to about 30 mm and, more desirably, in a range of from about 20 mm to about 25 mm. When the gap L1 is in the range described above, plasma can be maintained stably within the processing chamber 1. When the gap L1 is smaller than about 10 mm, an abnormal electric discharge may occur within the space S1 and the plasma may not be stabilized. In particular, if the gap L1 is smaller than the thickness of the sheath, it may be difficult to generate plasma within the processing chamber 1. When the gap L1 is greater than about 30 mm, the extended protrusion 60B may be too close to the electrode 7 in the mounting table 5. Thus, it may be difficult for the extended protrusion 60B to serve as the facing electrode, and the extended protrusion 60B may be damaged by a heat of the mounting table 5.

Likewise, in order to prevent the extended protrusion 60B from being too close to the electrode 7 in the mounting table 5, it may be desirable that an upper limit of a thickness L2 (i.e. a distance between the upper surface 60B1 and the lower surface 60B3) of the extended protrusion 60B may be, for example, about 20 mm. However, if the thickness L2 of the extended protrusion 60B is too small, an effect of the extended protrusion 60B as the facing electrode may be decreased. Thus, desirably, a lower limit of the thickness L2 may be, for example, about 5 mm. Therefore, the thickness L2 of the extended protrusion 60B may be, desirably, in a range of from about 5 mm to about 20 mm and, more desirably, in a range of from about 7 mm to about 17 mm.

A distance L3 from the lower surface 60B3 of the extended protrusion 60B to the upper surface of the mounting table 5 (herein, a height difference between two components) may be, for example, desirably, in a range of from about 15 mm to about 60 mm and, more desirably, in a range of from about 20 mm to about 25 mm in order for the extended protrusion 60B to serve as the facing electrode but not to be too close to the electrode 7 in the mounting table 5.

In the plasma processing apparatus 100 in accordance with the present embodiment, the gas inlet openings 15a may be positioned above the extended protrusion 60B and the processing gas may be supplied to the space S1 between the extended protrusion 60B and the microwave transmissive plate 28. With this configuration, it may be possible to promote a substitution and a discharge of the gas within the space S1 right below the microwave transmissive plate 28, and the processing gas may be activated easily. Therefore, it may be possible to efficiently generate plasma in the entire space S1 right below the microwave transmissive plate 28. Further, the space S1 may be a portion of the plasma generation space S. As another effect, as described in the following experiments, by supplying the processing gas into the space S1 right below the microwave transmissive plate 28, it may be possible to promote a discharge of oxygen released from the microwave transmissive plate 28 made of quartz to an outside of the processing chamber 1 when a plasma nitridation process is performed in the plasma processing apparatus 100. Therefore, it may be possible to suppress a decrease in a concentration of nitrogen contained in a formed nitride film. As the causes that the oxygen may be released from the microwave transmissive plate 28, the following two cases may be considered. First, the oxygen previously existing in the microwave transmissive plate 28 made of quartz is released. Second, when a plasma process is performed on the wafer W previously having an oxide film in the plasma processing apparatus 100, oxygen released from the wafer W may be attracted to the microwave transmissive plate 28, and then, the oxygen may be released during the plasma nitridation process.

In the plasma processing apparatus 100 in accordance with the present embodiment, the protective film 48 may be formed on the exposed surface of the protrusion 60 of the cover member 27 serving as the facing electrode. That is, the cover member 27 may be made of metal such as aluminum or aluminum alloy, and, thus, the cover member 27 may be coated with the protective film 48 as depicted in FIG. 2A in order to prevent metal contamination or particles generated when the cover member 27 is exposed to plasma and sputtered by the plasma. The protective film 48 may be formed on a surface of the contact support 60A and the upper surface 60B1, the leading end surface 60B2 and the lower surface 60B3 of the extended protrusion 60B. Desirably, the protective film 48 may be made of silicon considering contamination or particles generated when the protective film 48 is sputtered. The silicon may be crystalline silicon such as single crystalline silicon or polycrystalline silicon or may be amorphous silicon. Even if the protective film 48 is formed on the protrusion 60, the protrusion 60 can serve as the facing electrode and stable plasma can be generated, so that it may be possible to perform a uniform plasma process. The protective film 48 can suppress a short circuit or an abnormal electric discharge in other portion by efficiently forming a path of a high frequency current flowing from the mounting table 5 to the cover member 27 via the protrusion 60 as the facing electrode with the plasma generation space S therebetween. Further, the protective film 48 can protect the surface of the facing electrode from an oxidation reaction or sputtering with plasma, and prevent generation of contamination caused by metal such as aluminum which is a material of the facing electrode. When a silicon film serving as the protective film 48 is formed, even if the silicon film may be oxidized by an oxidation reaction with plasma and become a silicon dioxide film (a $SiO_2$ film), the $SiO_2$ film may be very thin, and the product of a dielectric constant and resistivity thereof may be low. Thus, the path of the current flowing from the mounting table 5 to the cover member 27 as the facing electrode with the plasma generation space S therebetween may rarely be interrupted. Accordingly, it may be possible to maintain the stable and appropriate path of the high frequency current.

Desirably, the silicon film as the protective film 48 may have low porosity in the film so as to be dense and have low resistivity. If porosity in the film is increased, volume resistivity may also be increased. Therefore, by way of example, if the porosity is in a range of from about 1% to about 10%, the volume resistivity may be, desirably, in a range of from about $5 \times 10^4$ $\Omega \cdot cm^2$ to about $5 \times 10^5$ $\Omega \cdot cm^2$. Desirably, such a silicon film may be formed by, for example, a plasma spraying method. Further, by way of example, a thickness of the protective film 48 may be, desirably, in a range of from about 10 μm to about 800 μm and, more desirably, in a range of from about 50 μm to about 500 μm and, still more desirably, in a range of from about 50 μm to about 150 μm. If the thickness of the protective film 48 is smaller than about 10 μm, a protection effect cannot be sufficiently secured. If the thickness of the protective film 48 is greater than about 800 μm, cracks or peeling-off may easily occur due to stress.

The protective film 48 may be formed by a thin film forming method such as PVD (Physical Vapor Deposition) and CVD (Chemical Vapor Deposition) other than the plasma spraying method. Among these methods, a spraying method may be desirable in that since it is relatively cheap and easy to perform, it may be possible to form the protective film of which porosity and volume resistivity can be controlled to be in a satisfactory range. The spraying method may include a flame spraying method, an arc spraying method, a laser spraying method, and a plasma spraying method. Among these methods, the plasma spraying method may be desirable in that it is easy to control and a high purity film can be formed. The plasma spraying method may include an atmospheric plasma spraying method and a vacuum plasma spraying method and either of them may be employed.

The protective film 48 may be made of, for example, TiN, $Y_2O_3$, $Al_2O_3$ or $SiO_2$ instead of silicon.

In the plasma processing apparatus 100 in accordance with the present embodiment, a cylindrical liner made of quartz may be provided at an inner periphery of the processing chamber 1. The liner may include the upper liner 49a as a first insulating plate and a lower liner 49b as a second insulating plate. The upper liner 49a is configured to cover an inner surface of the upper portion of the processing chamber 1, and the lower liner 49b is connected to the upper liner 49a and configured to cover an inner surface of the lower portion of the processing chamber 1. The upper liner 49a and the lower liner 49b may prevent a contact between a wall of the processing chamber 1 and plasma, and also prevent metal contamination caused by a material of the processing chamber 1. Further, the upper liner 49a and the lower liner 49b may prevent a short circuit or an abnormal electric discharge of the high frequency current from the mounting table 5 toward the sidewall 1b of the processing chamber 1. The lower liner 49b positioned to be adjacent to the mounting table 5 with a small gap therebetween may have a thickness much greater than that of the upper liner 49a. Each of the upper liner 49a and the lower liner 49b may have an enough thickness so as not to generate a short circuit or an abnormal electric discharge of the high frequency current, and the thickness may be set considering impedance. Desirably, the thickness of the lower liner 49b may be set to be larger than that of the upper liner 49a in a range of, for example, from about 2 mm to about 30 mm.

The lower liner 49b may be provided so as to cover at least a part of inner surfaces, desirably almost entire surfaces, of the processing chamber 1 and the exhaust chamber 11 positioned lower than the mounting table 5 having therein the electrode 7. The reason why the liner 49b is provided as stated above is that since a distance between the mounting table 5 and the processing chamber 1 becomes shortest below the mounting table 5, an abnormal electric discharge needs to be prevented in this region. The upper liner 49a and the lower liner 49b may be made of, desirably, quartz. However, a dielectric material such as ceramic, for example, $Al_2O_3$, AlN and $Y_2O_3$ may be employed. The upper liner 49a and the lower liner 49b may be coated with the above-described materials. Further, by way of example, surfaces of the upper liner 49a and the lower liner 49b made of aluminum may be coated with, for example, a $SiO_2$ film by the plasma spraying method.

Figure 4:
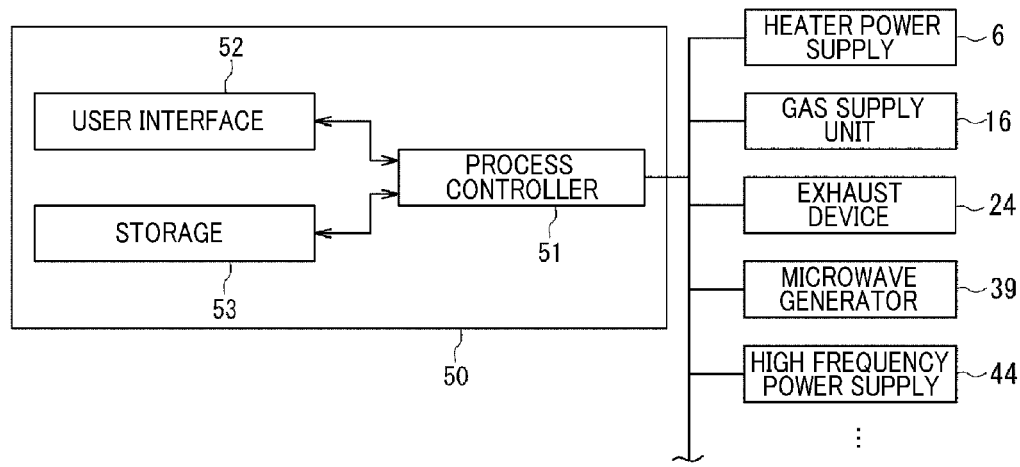
FIG. 4 is an explanatory diagram showing a configuration of a controller.

Each component of the plasma processing apparatus 100 may be connected to and controlled by a control unit 50 including a computer. The control unit 50 may include, for example, a process controller 51 including a CPU, a user interface 52 connected to the process controller 51, and storage 53 as depicted in FIG. 4. The process controller 51 may overall control components (for example, the heater power supply 6, the gas supply unit 16, the exhaust device 24, the microwave generator 39, the high frequency power supply 44 or the like) of the plasma processing apparatus 100. The components are related to process conditions such as a temperature, a pressure, a gas flow rate, a microwave output and a high frequency power for applying a bias.

The user interface 52 may include a keyboard with which a process manager may input a command to operate the plasma processing apparatus 100, or a display for visualizing and displaying an operational status of the plasma processing apparatus 100. The storage 53 may store therein control programs (software) for executing various processes performed in the plasma processing apparatus 100 under control of the process controller 51 or recipes including process condition data or the like.

If necessary, when a command is received from the user interface 52, the process controller 51 may retrieve a certain recipe from the storage 53 and execute it. Thus, a required process may be performed in the processing chamber 1 of the plasma processing apparatus 100 under control of the process controller 51. The control programs or recipes including the process condition data can be read out from a computer-readable storage medium (for example, a CD-ROM, a hard disk, a flexible disk, a flash memory, a DVD, a blue ray disk or the like). Otherwise, the recipes may be received from another apparatus via, for example, a dedicated line.

In the plasma processing apparatus 100 configured as described above, a plasma oxidation process or a plasma nitridation process can be performed without damage on an underlying film or a substrate (wafer W) at a low temperature in a range of, for example, from room temperature (about 25° C.) to about 600° C. Further, in the plasma processing apparatus 100, plasma may have high uniformity, and, thus, uniformity in a process can be secured for a large-diameter wafer W (target object).

Hereinafter, an operation of the plasma processing apparatus 100 will be explained. Above all, the wafer W may be loaded into the processing chamber 1 and mounted on the mounting table 5. Then, a processing gas from the gas supply unit 16 may be introduced into the processing chamber 1 through the gas supply channels 12, the annular path 13 and the gas inlet openings 15*a*. As the processing gas, a rare gas such as Ar, Kr or He may be used. In addition to the rare gas, an oxidizing gas such as $O_2$, $N_2O$, NO, $NO_2$ or $CO_2$ in case of the plasma oxidation process or a nitrogen-containing gas such as $N_2$ or $NH_3$ in case of the plasma nitridation process may be supplied at a certain flow rate. Further, in case of the plasma oxidation process, $H_2$ may be added if necessary.

Subsequently, a microwave from the microwave generator 39 may be introduced to the waveguide 37 via the matching circuit 38. The introduced microwave may pass through the rectangular waveguide 37*b*, the mode converter 40 and the coaxial waveguide 37*a* in sequence, and then, may be supplied into the planar antenna 31 via the internal conductor 41. Thereafter, the microwave may be radiated into the processing chamber 1 from the slot holes 32 of the planar antenna 31 through the microwave transmissive plate 28. In the meantime, the microwave may be propagated in a TE mode within the rectangular waveguide 37*b*. Then, the microwave of the TE mode may be converted into a TEM mode by the mode converter 40 and propagated within the coaxial waveguide 37*a* toward the planar antenna 31. By the microwave radiated from the planar antenna 31 into the processing chamber 1 through the microwave transmissive plate 28, an electromagnetic field may be generated in the processing chamber 1 and the processing gas may be excited into plasma.

Since the microwave may be radiated through the multiple slot holes 32 of the planar antenna 31, this plasma may have a high density in a range of from about $1\times10^{10}/cm^3$ to about $5\times10^{12}/cm^3$ and a low electron temperature of about 1.5 eV in a vicinity of the wafer W. Therefore, by applying this plasma to the wafer W, a process can be performed while suppressing plasma damage.

In the present embodiment, during a plasma process, a high frequency power of a certain frequency may be supplied from the high frequency power supply 44 to the electrode 7 in the mounting table 5. A frequency of the high frequency power supplied from the high frequency power supply 44 may be, desirably, in a range of, for example, from about 100 kHz to about 60 MHz and, more desirably, in a range of from about 400 kHz to about 13.5 MHz. By setting the frequency of the high frequency power to be in this range, a negative bias power can be efficiently applied to the mounting table 5.

The high frequency power may be applied, as a power density per unit area of the wafer W, desirably, in a range of, for example, from about 0.2 W/cm² to about 2.3 W/cm² and, more desirably, in a range of from about 0.35 W/cm² to about 1.2 W/cm². By setting the power density of the high frequency power to be in this range, the negative bias power can be efficiently applied to the mounting table 5.

Further, the high frequency power may be, desirably, in a range of from about 200 W to about 2000 W and, more desirably, in a range of from about 300 W to about 1200 W. By setting the high frequency power to be in this range, the negative bias power can be efficiently applied to the mounting table 5.

The high frequency power applied to the electrode 7 in the mounting table 5 may maintain the plasma at a low electron temperature, and attract ion species in the plasma toward the wafer W. Therefore, by supplying the high frequency power to the electrode 7 and applying the bias power to the wafer W, it is possible to increase a processing rate of the plasma oxidation process or the plasma nitridation process, and also possible to perform an uniform process on the wafer.

In this case, the high frequency power can be efficiently applied to the electrode 7 in the mounting table 5 from the high frequency power supply 44, with a low power loss, via the high frequency power inlet unit (the matching box 43 and the conductive plate 47 within the shield box 46) and the power supply line 42. The high frequency power applied to the electrode 7 may be transmitted from the mounting table 5 to the cover member 27 including the protrusion 60 serving as the facing electrode via the plasma generation space S, and then, transmitted to the earth of the high frequency power supply 44 via the sidewall 1*b* of the processing chamber 1 and a wall of the exhaust chamber 11. The above-described transmitting route of the high frequency power may form the high frequency current path (the RF return circuit). In the present embodiment, by providing the extended protrusion 60B, oscillation of the plasma potential Vp can be suppressed, and stable plasma can be generated within the processing chamber 1. Further, it may be possible to prevent the surface of the facing electrode from being sputtered by the plasma and from being a cause of metal contamination.

Further, on the exposed surface, facing the plasma generation space S, of the protrusion 60 serving as the facing electrode, the conductive protective film 48 (a silicon film or a $SiO_2$ film formed by oxidizing silicon) may be formed. Thus, the surface of the facing electrode can be protected. Further, it is possible to form the high frequency current path, through which the high frequency current may flow appropriately from the mounting table 5 to the cover member 27 as the facing electrode with the plasma generation space S therebetween, without any interruption. Further, the upper liner 49*a* and the lower liner 49*b* having a thickness greater than that of the upper liner 49*a* may be provided on the inner surface of the processing chamber 1 to be adjacent to the protective film 48. Thus, a short circuit or an abnormal electric discharge can be surely prevented at these components. That is, the abnormal electric discharge and the metal contamination can be prevented by the protective film 48.

As described above, in the plasma processing apparatus 100 in accordance with the present embodiment, by the extended protrusion 60B of the protrusion 60 serving as the facing electrode, the facing electrode may have a sufficiently large surface area, and the appropriate high frequency current path may be formed. Therefore, it may be possible to enhance power consumption efficiency of the high frequency bias power supplied to the electrode 7 in the mounting table 5 for mounting the wafer W thereon. Further, by forming the space S1 between the extended protrusion 60B and the microwave transmissive plate 28 and providing the facing electrode so as to protrude toward the plasma generation space S, it may be possible to generate stable plasma in the plasma generation space S and the space S1. Furthermore, by preventing the abnormal electric discharge, it may be possible to perform an efficient and stable process. Moreover, since the extended protrusion 60B may be provided with the gap L1 with respect to the microwave transmissive plate 28, it may not be necessary to reduce an effective area, through which the microwave is transmitted, of the microwave transmissive plate 28. Accordingly, it may be possible to introduce a sufficient microwave power, and also possible to stabilize plasma generated within the processing chamber 1.

Second Embodiment

Hereinafter, a plasma processing apparatus in accordance with a second embodiment of the present disclosure will be explained with reference to FIG. 5. A plasma processing apparatus 101 in accordance with the second embodiment is the same, except its features, as the plasma processing apparatus 100 in accordance with the first embodiment. Therefore, explanation (FIGS. 1, 3A and 4) of the whole configuration will be omitted. Some components illustrated in FIG. 5 which are the same as the components illustrated in FIG. 2A will be assigned same reference numerals and explanation thereof will be omitted.

In the plasma processing apparatus 101 in accordance with the present embodiment, at an inner peripheral surface of a cover member 27, a protrusion 61 may constitute a part of the cover member 27. Since the cover member 27 and the protrusion 61 are formed as a single body, thermal conductivity and electric conductivity can be secured. The protrusion 61 may include a contact support 61A and an extended protrusion 61B. The extended protrusion 61B of the protrusion 61 may include an upper surface 61B1, a leading end surface 61B2, and a lower surface 61B3. The protrusion 61 may be formed toward a plasma generation space S and may serve as a facing electrode (second electrode) facing an electrode 7 (first electrode) within a mounting table 5 with the plasma generation space S therebetween. To be specific, in FIG. 5, a surface ranging from a position A indicated by a circle to a position B indicated by a circle and including an exposed surface of the protrusion 61 (i.e. a surface of the contact support 61A and the upper surface 61B1, the leading end surface 61B2, and the lower surface 61B3 of the extended protrusion 61B) may serve as the facing electrode. Here, the position A is an end of a contact portion between the contact support 61A of the cover member 27 and the microwave transmissive plate 28. Further, the position B is an end (i.e., an end contacted with an upper liner 49a) of an exposed lower surface of the contact support 61A. In the present embodiment, the inner peripheral surface of the annular cover member 27 ranging from the position A to the position B may be exposed to the plasma generation space S and may serve as the facing electrode of an annular shape. In this way, by providing an annular member serving as a facing electrode so as to protrude toward the plasma generation space, even in the RLSA-type plasma processing apparatus 101 in which it is difficult to provide a facing electrode right above the mounting table 5 due to the microwave transmissive plate 28, the facing electrode may have a sufficiently large surface area.

Further, in the plasma processing apparatus 101 in accordance with the present embodiment, a front surface (i.e. the upper surface 61B1), the leading end surface 61B2, the lower surface 61B3 of the extended protrusion 61B of the protrusion 61 playing as a major role in the facing electrode may be formed to have a cross-sectional shape having prominences and depressions, and the facing electrode may have a sufficiently large surface area. With this shape of the extended protrusion 61B serving as the facing electrode, the facing electrode may have a large area within a limited space of a processing chamber 1. In the present embodiment, in order to generate stable plasma within the processing chamber 1 by suppressing the oscillation of the plasma potential and reduce sputtering by the plasma in a vicinity of the facing electrode, a ratio of the facing electrode surface area to a bias electrode area may be, desirably, about 1 or higher and, more desirably, in a range of from about 1 to about 5 and, still more desirably, in a range of from about 1 to about 4 and, still more desirably, in a range of from about 2 to about 4. The plasma processing apparatus 101 depicted in FIG. 5 has the area ratio of about 5.

Desirably, the leading end surface 61B2 of the protrusion 61 serving as the facing electrode may have a protruded length which does not reach a position $P_{WE}$ of a peripheral end of the wafer W mounted on the mounting table 5. If a leading end of the protrusion 61 reaches an inner position than the position $P_{WE}$ of the peripheral end of the wafer W, a range of plasma having a high density, generated within the processing chamber 1, may be smaller than a size of the wafer W and a density of the plasma at a periphery of the wafer W may be decreased. As a result, there may be a possibility that a process is not uniformly performed at an outer periphery of the wafer W. At a side (on the sidewall 1b's side of the processing chamber 1) opposite to the leading end (the leading end surface 61B2) of the protrusion 61 serving as the facing electrode, a contact end with the sidewall 1b may become a base end. However, in the present embodiment, it may be sufficient if the position B on the way to the base end is exposed to the plasma generation space S. That is, in the present embodiment, an end of the exposed lower surface of the contact support 61A of the protrusion 61 serving as the facing electrode may be a contact point with respect to the upper liner 49a. The contact point is indicated as the position B in FIG. 5.

Further, the upper surface 61B1 (facing the space S1) of the extended protrusion 61B may be spaced from a lower surface of the microwave transmissive plate 28. That is, the extended protrusion 61B may protrude toward the plasma generation space S with a gap L1 with respect to the microwave transmissive plate 28. In this way, since there is the gap L1 between the microwave transmissive plate 28 and the extended protrusion 61B, the facing electrode may have a sufficiently large surface area without reducing an effective area, through which a microwave is transmitted, of the microwave transmissive plate 28. The space S1 may become a portion of the plasma generation space S and plasma may also be generated in the space S1. Thus, a plasma process can be performed uniformly on the wafer W. On the contrary, if the microwave transmissive plate 28 and the extended protrusion 61B are brought into contact with each other without the gap L1 therebetween, in order for the facing electrode to have a large surface area within the processing chamber 1, a protruded amount of the extended protrusion 61B toward a center of the microwave transmissive plate 28 needs to be increased. In this case, when plasma is generated, the effective area of the microwave transmissive plate 28 may be decreased as much as a contact area with respect to the extended protrusion 61B. Therefore, a supply amount of a microwave power into the processing chamber 1 may be decreased. As a result, plasma may not be generated, or even if generated, the plasma may be unstable. In order to solve this problem, the processing chamber 1 needs to be larger, but an installation space and a manufacturing cost of the apparatus may be increased.

The gap L1 may be, desirably, greater than a thickness of a sheath between plasma generated right below the microwave transmissive plate 28 and the microwave transmissive plate 28, and sufficiently greater than a mean free path of electrons. By way of example, the gap L1 may be, desirably, in a range of from about 10 mm to about 30 mm and, more desirably, in a range of from about 20 mm to about 25 mm. When the gap L1 is smaller than about 10 mm, an abnormal electric discharge may occur within the space S1 and the plasma may not be stabilized. In particular, if the gap L1 is smaller than the thickness of the sheath, it may be difficult to generate plasma within the processing chamber 1. When the gap L1 is greater than about 30 mm, the extended protrusion 61B may be too close to the electrode 7 in the mounting table 5. Thus, it may be difficult for the extended protrusion 61B to serve as the facing electrode, and the extended protrusion 61B may be damaged by heat of the mounting table 5.

Likewise, in order to prevent the extended protrusion 61B from being too close to the electrode 7 in the mounting table 5, it may be desirable that an upper limit of a thickness L2 (i.e. a distance between the upper surface 61B1 and the lower surface 61B3) of the extended protrusion 61B may be, for example, about 20 mm. However, if the thickness L2 of the extended protrusion 61B is too small, an effect of the extended protrusion 61B as the facing electrode may be decreased. Thus, desirably, a lower limit of the thickness L2 may be, for example, about 5 mm. Therefore, the thickness L2 of the extended protrusion 61B may be, desirably, in a range of from about 5 mm to about 20 mm and more desirably, in a range of from about 7 mm to about 17 mm A distance L3 from the lower surface 61B3 of the extended protrusion 61B to the upper surface of the mounting table 5 (herein, a height difference between two components) may be, for example, desirably, in a range of from about 15 mm to about 60 mm and more desirably, in a range of from about 20 mm to about 25 mm in order for the extended protrusion 61B to serve as the facing electrode but not to be too close to the electrode 7 in the mounting table 5.

In the plasma processing apparatus 101 in accordance with the present embodiment, gas inlet openings 15a may be positioned at the contact support 61A above the extended protrusion 61B and a processing gas may be supplied to the space S1 between the extended protrusion 61B and the microwave transmissive plate 28. With this configuration, it may be possible to promote a substitution and a discharge of a gas in the space S1 (which serves as a portion of the plasma generation space S) right below the microwave transmissive plate 28, and the processing gas may be activated easily. Therefore, it may be possible to efficiently generate plasma in the entire space S1 right below the microwave transmissive plate 28. As another effect, by supplying the processing gas into the space S1 right below the microwave transmissive plate 28, it may be possible to promote a discharge of oxygen released from the microwave transmissive plate 28 made of quartz when a plasma nitridation process is performed in the plasma processing apparatus 101. Therefore, it may be possible to suppress a decrease in a concentration of nitrogen contained in a formed nitride film.

In the present embodiment, a protective film 48 may be formed on the exposed surface of the protrusion 61. The protective film 48 may prevent the protrusion 61 from being exposed to plasma and sputtered by the plasma to generate metal contamination or particles. Even if the protective film 48 is formed on the protrusion 61, the protrusion 61 can serve as the facing electrode and stable plasma can be generated, so that it may be possible to perform a uniform plasma process.

Figure 5:
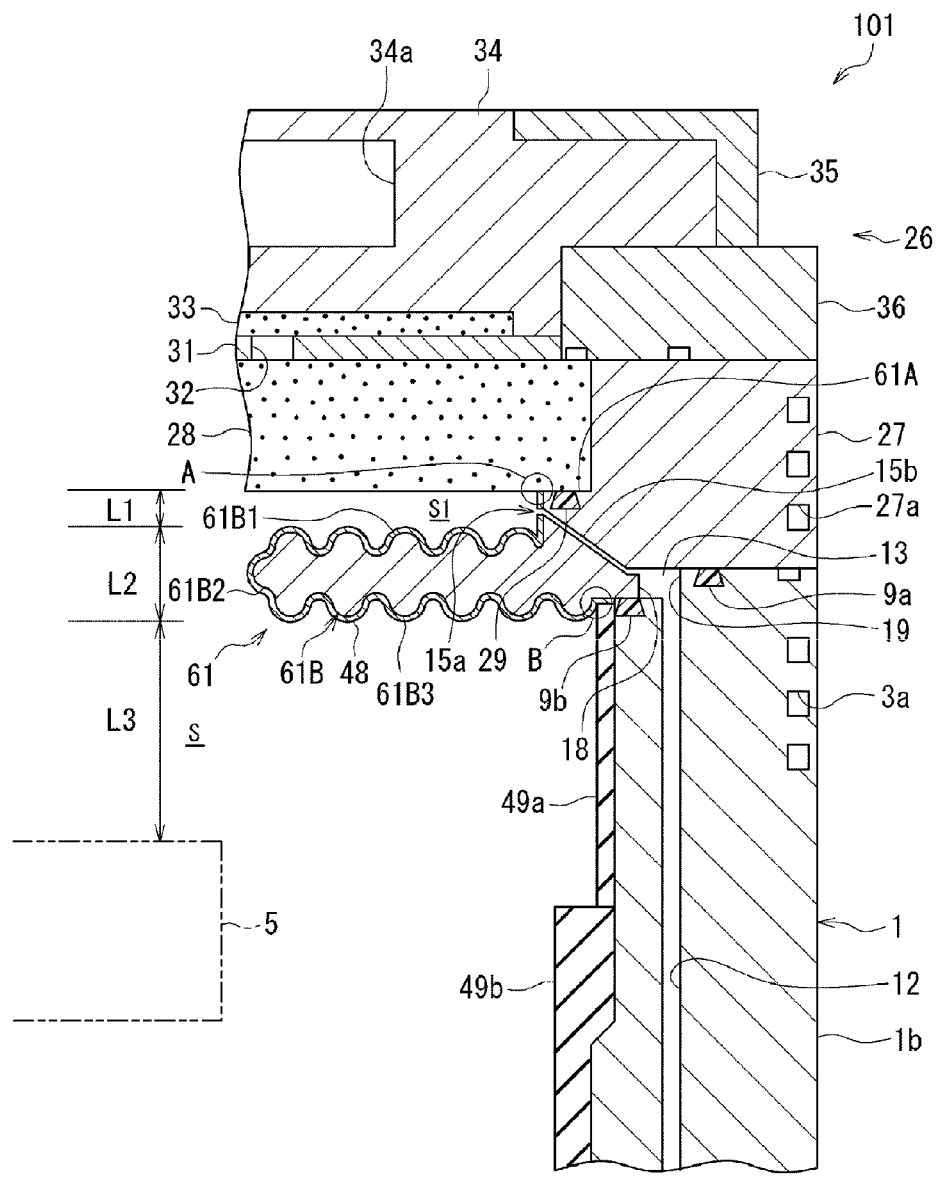
FIG. 5 is a cross sectional view of main parts of a plasma processing apparatus in accordance with a second embodiment of the present disclosure.

The prominences and depressions of the extended protrusion 61B may be not limited to a shape as depicted in FIG. 5. In order for the extended protrusion 61B to have a greater surface area, a certain shape such as a groove shape or a hole shape may be selected. However, in order to prevent an abnormal electric discharge or generation of particles on the surface of the extended protrusion 61B protruding toward the plasma generation space S, it is desirable that angled portions of the extended protrusion 61B may be formed in rounded shapes as depicted in FIG. 5. Further, it is not necessary to form the prominences and depressions on the entire surface of the extended protrusion 61B. Instead, by way of example, the prominences and depressions may be formed only on the upper surface 61B1 or lower surface 61B3 of the extended protrusion 61B.

Other configurations and effects of the present embodiment are the same as those of the first embodiment.

Third Embodiment

Figure 6:
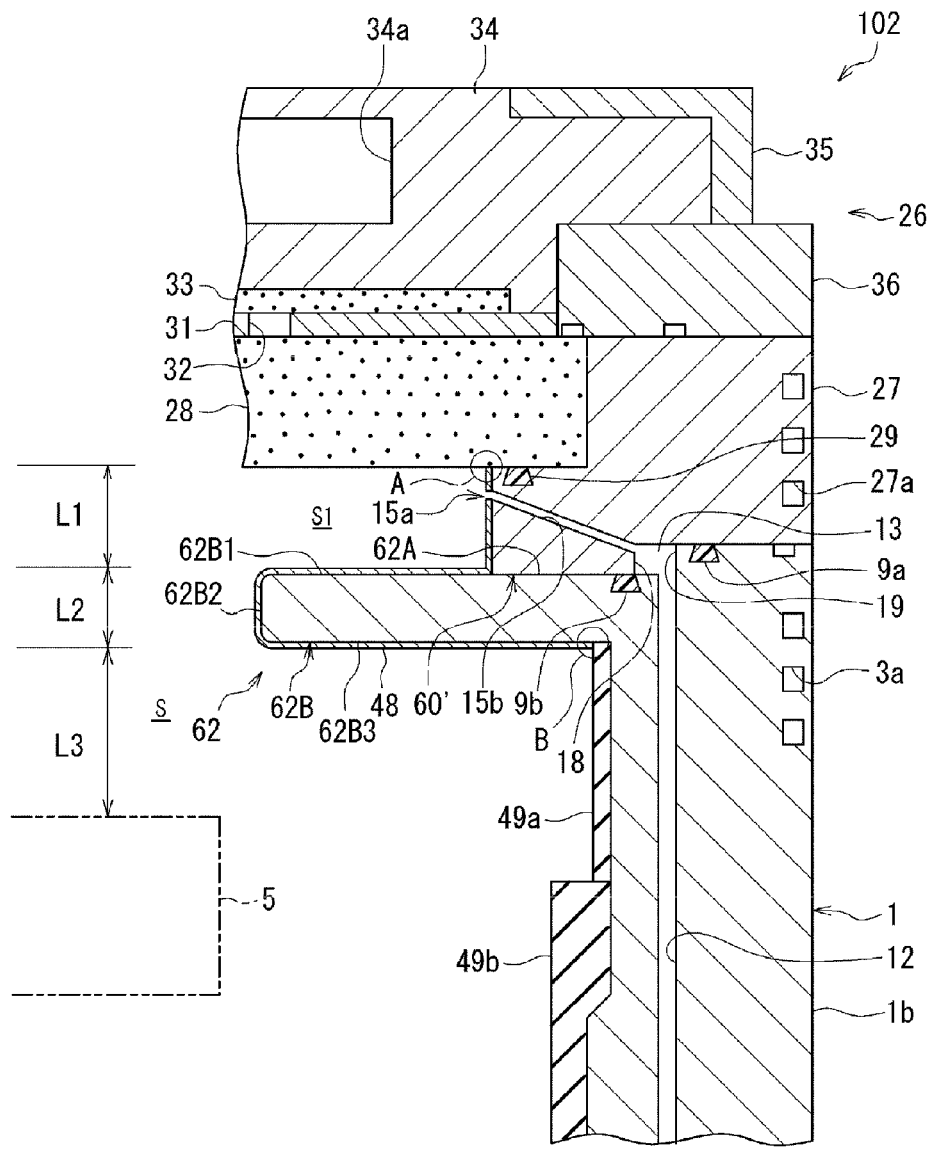
FIG. 6 is a cross sectional view of main parts of a plasma processing apparatus in accordance with a third embodiment of the present disclosure.

Hereinafter, a plasma processing apparatus in accordance with a third embodiment of the present disclosure will be explained with reference to FIG. 6. A plasma processing apparatus 102 in accordance with the third embodiment is the same, except its features, as the plasma processing apparatus 100 in accordance with the first embodiment. Therefore, explanation (FIGS. 1, 3A and 4) of the whole configuration will be omitted. Some components illustrated in FIG. 6 which are the same as the components illustrated in FIG. 2A will be assigned same reference numerals and explanation thereof will be omitted.

In the plasma processing apparatuses in accordance with the first and second embodiments, extended protrusions 60B and 61B may be respectively formed at protrusions 60 and 61 of a cover member 27 as the facing electrode. However, in the plasma processing apparatus 102 in accordance with the present embodiment, an extended protrusion 62 protruding inwards may be formed at an upper region of a processing chamber 1 as a part of the processing chamber 1, so that an area serving as the facing electrode can be increased. Since the processing chamber 1 and the protrusion 62 are formed as a single body, thermal conductivity and electric conductivity can be secured. The extended protrusion 62 may be partially contacted with a contact support 60' of the cover member 27 and may be electrically connected to the contact support 60'. The contact support 60' may support a microwave transmissive plate 28.

The extended protrusion 62 may be formed at an upper end of a sidewall 1b of the processing chamber 1. The extended protrusion 62 may include a contact section 62A in contact with a contact support 60' of the cover member 27 and an exposed portion 62B including an exposed upper surface 62B1, a leading end surface 62B2 and a lower surface 62B3. The contact support 60' and the extended protrusion 62 may be formed toward a plasma generation space S and may serve as a facing electrode (second electrode) in pairs with respect to an electrode 7 (first electrode) within a mounting table 5 with the plasma generation space S therebetween. To be specific, in FIG. 6, an inner peripheral surface ranging from a position A indicated by a circle to a position B indicated by a circle and including an exposed surface of the contact support 60' and a surface of the extended protrusion 62 (i.e. the exposed upper surface 62B1, the leading end surface 62B2, and lower surface 62B3 of the extended protrusion 62) may serve as the facing electrode. Here, the position A is an end of a contact portion between the contact support 60' of the cover member 27 and the microwave transmissive plate 28. Further, the position B is an end (i.e., an end contacted with an upper liner 49a) of an exposed lower surface of the extended protrusion 62. In the present embodiment, the surface ranging from the position A to the position B may be exposed to the plasma generation space S and may serve as the facing electrode of an annular shape. In this way, the facing electrode can be formed by multiple components (the cover member 27 and the processing chamber 1) having surfaces facing the plasma generation space S. By providing an annular member serving as a facing electrode so as to protrude toward the plasma generation space, even in the RLSA-type plasma processing apparatus 102 in which it is difficult to provide a facing electrode right above the mounting table 5 due to the microwave transmissive plate 28, the facing electrode may have a sufficiently large surface area. Further, in the present embodiment, the extended protrusion 62 as an extended part of the facing electrode may be formed at the upper region of the processing chamber 1, and, thus, it may be effective in reducing a distance (gap G; see FIG. 1) from a surface of a wafer W mounting on the mounting table 5 to the microwave transmissive plate 28.

In the present embodiment, in order to generate stable plasma within the processing chamber 1 by suppressing the oscillation of the plasma potential and reduce sputtering by the plasma in a vicinity of the facing electrode, a ratio of the facing electrode surface area to a bias electrode area may be, desirably, about 1 or higher and, more desirably, in a range of from about 1 to about 5 and, still more desirably, in a range of from about 1 to about 4 and, still more desirably, in a range of from about 2 to about 4.

Desirably, the leading end surface 62B2 of the extended protrusion 62 serving as the facing electrode may have a protruded length which does not reach a position $P_{WE}$ of a peripheral end of the wafer W mounted on the mounting table 5. If a leading end of the extended protrusion 62 reaches an inner position than the position $P_{WE}$ of the peripheral end of the wafer W, a range of plasma having a high density, generated within the processing chamber 1, may be smaller than a size of the wafer W and a density of the plasma at a periphery of the wafer W may be decreased. As a result, there may be a possibility that a process is not uniformly performed at an outer periphery of the wafer W. At a side (on the sidewall 1b's side of the processing chamber 1) opposite to the leading end (the leading end surface 62B2) in the extended protrusion 62 serving as the facing electrode, an angled portion bending from the sidewall 1b may become a base end. However, in the present embodiment, it may be sufficient if the position B on the way to the base end is exposed to the plasma generation space S. That is, in the present embodiment, an end of the exposed lower surface of the extended protrusion 62 serving as the facing electrode may be a contact point with respect to the upper liner 49a. The contact point is indicated as the position B in FIG. 6.

Further, the upper surface 62B1 (facing the space S1) of the extended protrusion 62 may be spaced from a lower surface of the microwave transmissive plate 28. That is, the extended protrusion 62 may protrude toward the plasma generation space S with a gap L1 with respect to the microwave transmissive plate 28. In this way, since there is the gap L1 between the microwave transmissive plate 28 and the extended protrusion 62, the facing electrode may have a sufficiently large surface area without reducing an effective area, through which a microwave is transmitted, of the microwave transmissive plate 28. The space S1 may become a portion of the plasma generation space S and plasma may also be generated in the space S1. Thus, a plasma process can be performed uniformly on the wafer W. On the contrary, if the microwave transmissive plate 28 and the extended protrusion 62 are brought into contact with each other without the gap L1 therebetween, in order for the facing electrode to have a large surface area within the processing chamber 1, a protruded amount of the extended protrusion 62 toward a center of the microwave transmissive plate 28 needs to be increased. In this case, when plasma is generated, the effective area of the microwave transmissive plate 28 may be decreased as much as a contact area with the upper surface 62B1 of the extended protrusion 62. Therefore, a supply amount of a microwave power into the processing chamber 1 may be decreased. As a result, plasma may not be generated, or even if generated, the plasma may be unstable. In order to solve this problem, the processing chamber 1 needs to be larger, but an installation space and a manufacturing cost of the apparatus may be increased.

The gap L1 may be, desirably, greater than a thickness of a sheath between plasma generated right below the microwave transmissive plate 28 and the microwave transmissive plate 28 and by way of example, the gap L1 may be, desirably, in a range of from about 10 mm to about 30 mm and more desirably, in a range of from about 20 mm to about 25 mm. When the gap L1 is smaller than about 10 mm, an abnormal electric discharge may occur within the space S1 and the plasma may not be stabilized. In particular, if the gap L1 is equal to or smaller than the thickness of the sheath, it may be difficult to generate plasma within the processing chamber 1. When the gap L1 is greater than about 30 mm, the extended protrusion 62 may be too close to the electrode 7 in the mounting table 5. Thus, it may be difficult for the extended protrusion 62 to serve as the facing electrode and the extended protrusion 62 may be damaged by heat of the mounting table 5.

Likewise, in order to prevent the extended protrusion 62 from being too close to the electrode 7 in the mounting table 5, it may be desirable that an upper limit of a thickness L2 (i.e. a distance between the upper surface 62B1 and the lower surface 62B3) of the extended protrusion 62 may be, for example, about 20 mm. However, if the thickness L2 of the extended protrusion 62 is too small, an effect of the extended protrusion 62 as the facing electrode may be decreased. Thus, desirably, a lower limit of the thickness L2 may be, for example, about 5 mm. Therefore, the thickness L2 of the extended protrusion 62 may be, desirably, in a range of from about 5 mm to about 20 mm and more desirably, in a range of from about 7 mm to about 17 mm.

A distance L3 from the lower surface 62B3 of the extended protrusion 62 to the upper surface of the mounting table 5 (herein, a height difference between two components) may be, for example, desirably, in a range of from about 15 mm to about 60 mm and more desirably, in a range of from about 20 mm to about 25 mm in order for the extended protrusion 62 to serve as the facing electrode but not to be too close to the electrode 7 in the mounting table 5.

In the plasma processing apparatus 102 in accordance with the present embodiment, gas inlet openings 15a may be positioned at the contact support 60' above the extended protrusion 62 and a processing gas may be supplied to the space S1 between the extended protrusion 62 and the microwave transmissive plate 28. With this configuration, it may be possible to promote a substitution and a discharge of a gas in the space S1 (which serves as a portion of the plasma generation space S) right below the microwave transmissive plate 28, and the processing gas may be activated easily. Therefore, it may be possible to efficiently generate plasma in the entire space S1 right below the microwave transmissive plate 28. As another effect, by supplying the processing gas into the space S1 right below the microwave transmissive plate 28, it may be possible to promote a discharge of oxygen released from the microwave transmissive plate 28 made of quartz when a plasma nitridation process is performed in the plasma processing apparatus 102. Therefore, it may be possible to suppress a decrease in a concentration of nitrogen contained in a formed nitride film.

In the plasma processing apparatus 102 in accordance with present embodiment, a protective film 48 may be formed on surfaces of the contact support 60' and the extended protrusion 62 serving as the facing electrode. That is, as depicted in FIG. 6, the protective film 48 may be formed on a surface of the contact support 60' of the aluminum cover member 27 exposed to plasma. Further, the protective film 48 may be formed on a surface of the extended protrusion 62 exposed to plasma within the processing chamber 1. The protective film 48 may prevent the contact support 60' and the extended protrusion 62 from being exposed to plasma and sputtered by the plasma to generate metal contamination or particles. Even if the protective film 48 is formed on the contact support 60' or the extended protrusion 62, the contact support 60' or the extended protrusion 62 can serve as the facing electrode and stable plasma can be generated, so that it may be possible to perform a uniform plasma process.

Other configurations and effects of the present embodiment are the same as those of the first embodiment.

Fourth Embodiment

Hereinafter, a plasma processing apparatus in accordance with a fourth embodiment of the present disclosure will be explained with reference to FIG. 7. A plasma processing apparatus 103 in accordance with the fourth embodiment is the same, except its features, as the plasma processing apparatus 100 in accordance with the first embodiment. Therefore, explanation (FIGS. 1, 3A and 4) of the whole configuration will be omitted. Some components illustrated in FIG. 7 which are the same as the components illustrated in FIG. 2A will be assigned same reference numerals and explanation thereof will be omitted.

In the plasma processing apparatus 103 in accordance with the present embodiment, an extended protrusion 63 may be provided such that an annular auxiliary electrode member may detachably attach to a contact support 60' of a cover member 27. In this way, an auxiliary member may be provided as a part or the whole of a facing electrode. Since the extended protrusion 63 is formed as a separate component from the cover member 27 or a processing chamber 1, it may be easy to replace the extended protrusion 63 as consumables. The extended protrusion 63 may include an upper surface 63a, a leading end surface 63b and a lower surface 63c.

A material of the auxiliary electrode member of the extended protrusion 63 may be not limited if it is a conductive material. By way of example, it may be possible to employ a metal material such as aluminum, aluminum alloy or stainless steel, or also employ silicon. In particular, if the extended protrusion 63 is made of silicon, the silicon may have an advantage since it is not necessary to form a protective film on a surface of the extended protrusion 63. The extended protrusion 63 may be fixed to an inner peripheral surface of the contact support 60' of the cover member 27 by, for example, a non-illustrated screw in a certain fixing direction.

Further, in the plasma processing apparatus 103 in accordance with the present embodiment, the extended protrusion 63 may be formed toward a plasma generation space S and may serve as a facing electrode (second electrode) facing an electrode 7 (first electrode) within a mounting table 5 with the plasma generation space S therebetween. To be specific, in FIG. 7, an inner peripheral surface ranging from a position A indicated by a circle to a position B indicated by a circle and including an exposed surface of the contact support 60' and an exposed surface of the extended protrusion 63 (i.e. the exposed upper surface 63a, leading end surface 63b, and lower surface 63c of the extended protrusion 63) may serve as the facing electrode. Here, the position A is an end of a contact portion between the contact support 60' of the cover member 27 and the microwave transmissive plate 28. Further, the position B is an end (i.e., an end contacted with an upper liner 49a) of an exposed surface of the contact support 60'. In the present embodiment, the surface ranging from the position A to the position B may be exposed to the plasma generation space S and may serve as the facing electrode of an annular shape. In this way, the facing electrode may be formed by multiple components (the cover member 27 and an auxiliary electrode member of the extended protrusion 63) having surfaces facing the plasma generation space S. By providing an annular member serving as a facing electrode so as to protrude toward the plasma generation space, even in the RLSA-type plasma processing apparatus 103 in which it is difficult to provide a facing electrode right above the mounting table 5 due to the microwave transmissive plate 28, the facing electrode may have a sufficiently large surface area.

Further, in the present embodiment, by additionally attaching the extended protrusion 63 to the contact support 60' of the cover member 27, the portion serving as the facing electrode can have a sufficiently large surface area. In this way, the facing electrode may be formed by combining the multiple components, and, thus, the facing electrode can have a sufficiently large area within a limited space of a processing chamber 1. In the present embodiment, in order to generate stable plasma within the processing chamber 1 by suppressing the oscillation of the plasma potential and reduce sputtering by the plasma in a vicinity of the facing electrode, a ratio of the facing electrode surface area to a bias electrode area may be, desirably, about 1 or higher and, more desirably, in a range of from about 1 to about 5 and, still more desirably, in a range of from about 1 to about 4 and, still more desirably, in a range of from about 2 to about 4.

Desirably, a leading end (the leading end surface 63b) of the extended protrusion 63 serving as the facing electrode may have a protruded length which does not reach a position $P_{WE}$ of a peripheral end of the wafer W mounted on the mounting table 5. If the leading end of the extended protrusion 63 reaches an inner position than the position $P_{WE}$ of the peripheral end of the wafer W, a range of plasma having a high density, generated within the processing chamber 1, may be smaller than a size of the wafer W and a density of the plasma at a periphery of the wafer W may be decreased. As a result, there may be a possibility that a process is not uniformly performed at an outer periphery of the wafer W. At a side opposite to the leading end (the leading end surface 63b) in the extended protrusion 63, a portion ranging from a contact portion between the extended protrusion 63 and the contact support 60' to the position B may also be exposed to the plasma generation space S. That is, in the present embodiment, an end of the exposed lower surface of the contact support 60' serving as the facing electrode may be a contact point with respect to an upper liner 49a. The contact point is indicated as the position B in FIG. 7.

Further, the upper surface 63a of the extended protrusion 63 may be spaced from a lower surface of the microwave transmissive plate 28. That is, the extended protrusion 63 may protrude toward the plasma generation space S with a gap L1 with respect to the microwave transmissive plate 28. In this way, since there is the gap L1 between the microwave transmissive plate 28 and the extended protrusion 63, the facing electrode may have a sufficiently large surface area without reducing an effective area, through which a microwave is transmitted, of the microwave transmissive plate 28. The space S1 may become a portion of the plasma generation space S and plasma may also be generated in the space S1. Thus, a plasma process can be performed uniformly on the wafer W. On the contrary, if the microwave transmissive plate 28 and the extended protrusion 63 are brought into contact with each other without the gap L1 therebetween, in order for the facing electrode to have a large surface area within the processing chamber 1, a protruded amount of the extended protrusion 63 toward a center of the microwave transmissive plate 28 needs to be increased. In this case, when plasma is generated, the effective area of the microwave transmissive plate 28 may be decreased as much as a contact area with the upper surface 63a of the extended protrusion 63. Therefore, a supply amount of a microwave power into the processing chamber 1 may be decreased. As a result, plasma may not be generated, or even if generated, the plasma may be unstable. In order to solve this problem, the processing chamber 1 needs to be larger, but an installation space and a manufacturing cost of the apparatus may be increased.

The gap L1 may be, desirably, greater than a thickness of a sheath between plasma generated right below the microwave transmissive plate 28 and the microwave transmissive plate 28 and by way of example, the gap L1 may be, desirably, in a range of from about 10 mm to about 30 mm and more desirably, in a range of from about 20 mm to about 25 mm. When the gap L1 is smaller than about 10 mm, an abnormal electric discharge may occur within the space S1 and the plasma may not be stabilized. In particular, if the gap L1 is equal to or smaller than the thickness of the sheath, it may be difficult to generate plasma within the processing chamber 1. When the gap L1 is greater than about 30 mm, the extended protrusion 63 may be too close to the electrode 7 in the mounting table 5. Thus, it may be difficult for the extended protrusion 63 to serve as the facing electrode and the extended protrusion 63 may be damaged by heat of the mounting table 5.

Likewise, in order to prevent the extended protrusion 63 from being too close to the electrode 7 in the mounting table 5, it may be desirable that an upper limit of a thickness L2 (i.e. a distance between the upper surface 63a and the lower surface 63c) of the extended protrusion 63 may be, for example, about 20 mm. However, if the thickness L2 of the extended protrusion 63 is too small, an effect of the extended protrusion 63 as the facing electrode may be decreased. Thus, desirably, a lower limit of the thickness L2 may be, for example, about 5 mm. Therefore, the thickness L2 of the extended protrusion 63 may be, desirably, in a range of from about 5 mm to about 20 mm and more desirably, in a range of from about 7 mm to about 17 mm.

A distance L3 from the lower surface 63c of the extended protrusion 63 to the upper surface of the mounting table 5 (herein, a height difference between two components) may be, for example, desirably, in a range of from about 15 mm to about 60 mm and more desirably, in a range of from about 20 mm to about 25 mm in order for the extended protrusion 63 to serve as the facing electrode but not to be too close to the electrode 7 in the mounting table 5.

In the plasma processing apparatus 103 in accordance with the present embodiment, gas inlet openings 15a may be positioned at the contact support 60' above the extended protrusion 63 and a processing gas may be supplied to the space S1 between the extended protrusion 63 and the microwave transmissive plate 28. With this configuration, it may be possible to promote a substitution and a discharge of a gas in the space S1 (which serves as a portion of the plasma generation space S) right below the microwave transmissive plate 28, and the processing gas may be activated easily. Therefore, it may be possible to efficiently generate plasma in the entire space S1 right below the microwave transmissive plate 28. As another effect, by supplying the processing gas into the space S1 right below the microwave transmissive plate 28, it may be possible to promote a discharge of oxygen released from the microwave transmissive plate 28 made of quartz when a plasma nitridation process is performed in the plasma processing apparatus 103. Therefore, it may be possible to suppress a decrease in a concentration of nitrogen contained in a formed nitride film.

Figure 7:
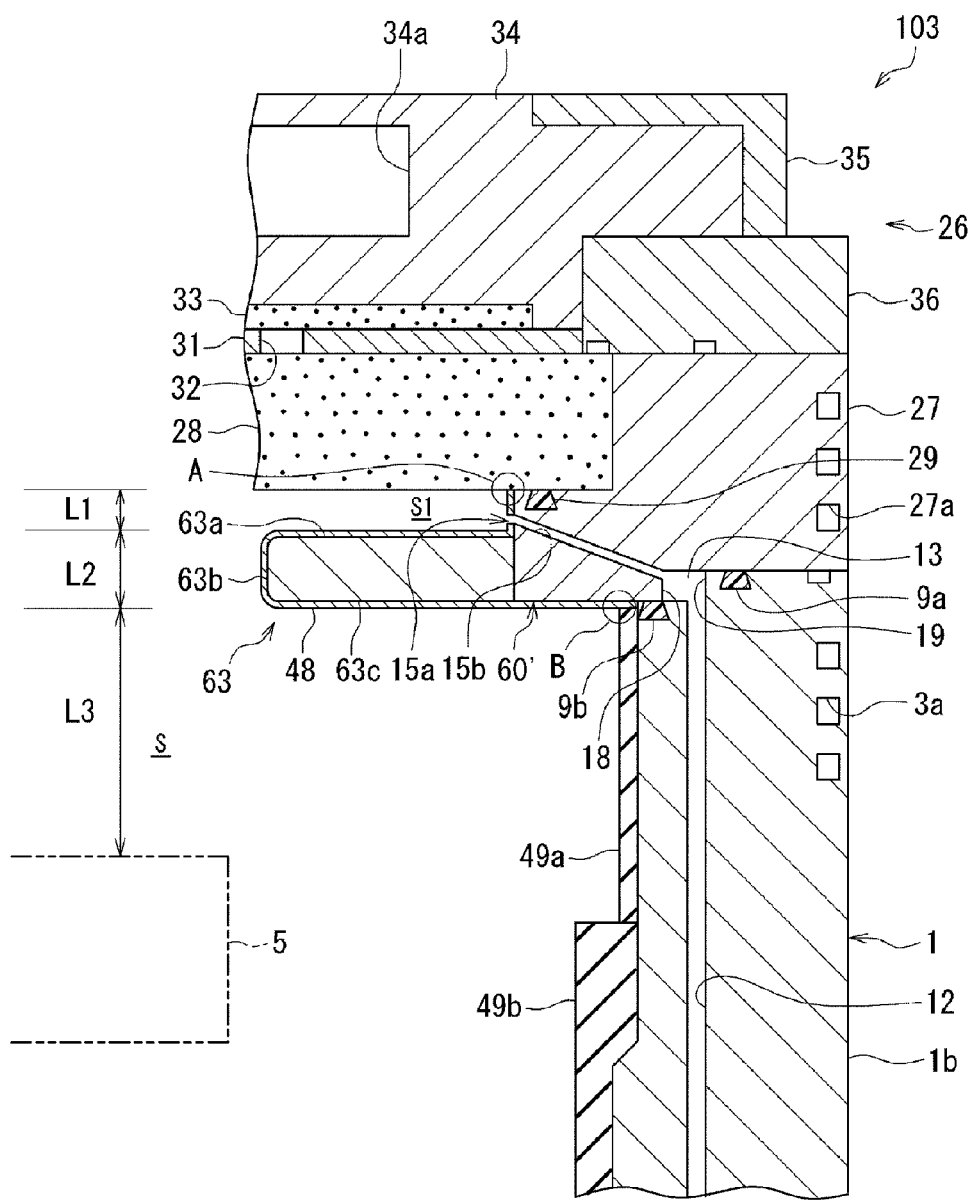
FIG. 7 is a cross sectional view of main parts of a plasma processing apparatus in accordance with a fourth embodiment of the present disclosure.

A cross sectional shape of the extended protrusion 63 may not be limited to the shape as depicted in FIG. 7. In order for the extended protrusion 63 to have a greater surface area, a certain shape, for example, a L-shaped cross sectional shape may be selected. Otherwise, prominences and depressions or groove may be formed on a surface of the extended protrusion 63. However, in order to prevent an abnormal electric discharge or generation of particles on the surface of the extended protrusion 63 protruding toward the plasma generation space S, it is desirable that angled portions of the extended protrusion 63 may be formed in rounded shapes as depicted in FIG. 7. In the present embodiment, a protective film 48 may be formed on the exposed surfaces of the contact support 60' and the extended protrusion 63 facing the plasma generation space S. The protective film 48 may prevent the contact support 60' and the extended protrusion 63 from being exposed to plasma and sputtered by the plasma to generate metal contamination or particles. Even if the protective film 48 is formed on the contact support 60' and extended protrusion 63, the contact support 60' and extended protrusion 63 can serve as the facing electrode and stable plasma can be generated, so that it may be possible to perform a uniform plasma process. Further, if the entire extended protrusion 63 is made of silicon, the protective film may not be formed thereon.

Other configurations and effects of the present embodiment are the same as those of the first embodiment.

Fifth Embodiment

Hereinafter, a plasma processing apparatus in accordance with a fifth embodiment of the present disclosure will be explained with reference to FIG. 8. A plasma processing apparatus 104 in accordance with the fifth embodiment is the same, except its features, as the plasma processing apparatus 100 in accordance with the first embodiment. Therefore, explanation (FIGS. 1, 3A and 4) of the whole configuration will be omitted. Some components illustrated in FIG. 8 which are the same as the components illustrated in FIG. 2A will be assigned same reference numerals and explanation thereof will be omitted.

In the plasma processing apparatus 103 in accordance with the fourth embodiment, the extended protrusion 63 (auxiliary electrode member) may be provided at the cover member 27. However, in the plasma processing apparatus 104 in accordance with the present embodiment, an extended protrusion 64 (annular auxiliary electrode member) may be provided so as to detachably attach to an upper region of a processing chamber 1. In this way, an auxiliary member may be provided as a part or the whole of a facing electrode. Since the extended protrusion 64 is formed as a separate component from the cover member 27 or the processing chamber 1, it may be easy to replace the extended protrusion 64 as consumables. The extended protrusion 64 may include an upper surface 64a, a leading end surface 64b and a lower surface 64c. At the upper surface 64a of the extended protrusion 64, a step-shaped portion may be formed corresponding to a shape of a contact support 60' of the cover member 27. Further, the lower surface 64c of the extended protrusion 64 may include multiple (two in FIG. 8) annular grooves 64d.

A material of the extended protrusion 64 may be not limited if it is a conductive material. By way of example, it may be possible to employ a metal material such as aluminum, aluminum alloy or stainless steel, or also employ silicon. If the extended protrusion 64 is made of silicon, the silicon may have an advantage since it is not necessary to form a protective film on a surface of the extended protrusion 64. The extended protrusion 64 may be fixed to an inner peripheral surface of a sidewall 1b of the processing chamber 1 by, for example, a non-illustrated screw in a certain fixing direction.

Further, in the plasma processing apparatus 104 in accordance with the present embodiment, the extended protrusion 64 may be formed toward a plasma generation space S and may serve as a facing electrode (second electrode) facing an electrode 7 (first electrode) within a mounting table 5 with the plasma generation space S therebetween. To be specific, in FIG. 8, an inner peripheral surface ranging from a position A indicated by a circle to a position B indicated by a circle and including an exposed surface of the contact support 60' and an exposed surface of the extended protrusion 64 (i.e. the exposed upper surface 64a, leading end surface 64b, and lower surface 64c of the extended protrusion 64) may serve as the facing electrode. Here, the position A is an end of a contact portion between the contact support 60' of the cover member 27 and the microwave transmissive plate 28. Further, the position B is an end (i.e., an end contacted with an upper liner 49a) of an exposed lower surface of the extended protrusion 64. In the present embodiment, the surface ranging from the position A to the position B may be exposed to the plasma generation space S and may serve as the facing electrode of an annular shape. In this way, the facing electrode may be formed by multiple components (the cover member 27 and the extended protrusion 64) having surfaces facing the plasma generation space S. By providing an annular member serving as a facing electrode so as to protrude toward the plasma generation space, even in the RLSA-type plasma processing apparatus 104 in which it is difficult to provide a facing electrode right above the mounting table 5 due to the microwave transmissive plate 28, the facing electrode may have a sufficiently large surface area.

Further, in the present embodiment, by additionally attaching the extended protrusion 64 to the contact support 60' of the cover member 27, the portion serving as the facing electrode can have a sufficiently large surface area. In this way, the facing electrode may be formed by combining the multiple components, and, thus, the facing electrode can have a sufficiently large area within a limited space of a processing chamber 1. In the present embodiment, in order to generate stable plasma within the processing chamber 1 by suppressing the oscillation of the plasma potential and reduce sputtering by the plasma in a vicinity of the facing electrode, a ratio of the facing electrode surface area to a bias electrode area may be, desirably, about 1 or higher and more desirably, in a range of from about 1 to about 5 and still more desirably, in a range of from about 1 to about 4 and still more desirably, in a range of from about 2 to about 4.

Desirably, a leading end (the leading end surface 64b) of the extended protrusion 64 serving as the facing electrode may have a protruded length which does not reach a position $P_{WE}$ of a peripheral end of the wafer W mounted on the mounting table 5. If the leading end of the extended protrusion 64 reaches an inner position than the position $P_{WE}$ of the peripheral end of the wafer W, a range of plasma having a high density, generated within the processing chamber 1, may be smaller than a size of the wafer W and a density of the plasma at a periphery of the wafer W may be decreased. As a result, there may be a possibility that a process is not uniformly performed at an outer periphery of the wafer W. At a side opposite to the leading end (the leading end surface 64b) in the extended protrusion 64, a contact end with respect to a sidewall 1b may become a base end. However, in the present embodiment, the position B on the way to the base end is exposed to the plasma generation space S. That is, in the present embodiment, an end of the exposed lower surface of the extended protrusion 64 serving as the facing electrode may be a contact point with respect to an upper liner 49a. The contact point is indicated as the position B in FIG. 8.

Further, the upper surface 64a of the extended protrusion 64 may be spaced from a lower surface of the microwave transmissive plate 28. That is, the extended protrusion 64 may protrude toward the plasma generation space S with a gap L1 with respect to the microwave transmissive plate 28. In this way, since there is the gap L1 between the microwave transmissive plate 28 and the extended protrusion 64, the facing electrode may have a sufficiently large surface area without reducing an effective area, through which a microwave is transmitted, of the microwave transmissive plate 28. The space S1 may become a portion of the plasma generation space S and plasma may also be generated in the space S1. Thus, a plasma process can be performed uniformly on the wafer W. On the contrary, if the microwave transmissive plate 28 and the extended protrusion 64 are brought into contact with each other without the gap L1 therebetween, in order for the facing electrode to have a large surface area within the processing chamber 1, a protruded amount of the extended protrusion 64 toward a center of the microwave transmissive plate 28 needs to be increased. In this case, when plasma is generated, the effective area of the microwave transmissive plate 28 may be decreased as much as a contact area with the upper surface 64a of the extended protrusion 64. Therefore, a supply amount of a microwave power supplied into the processing chamber 1 may be decreased. As a result, plasma may not be generated, or even if generated, the plasma may be unstable. In order to solve this problem, the processing chamber 1 needs to be larger, but an installation space and a manufacturing cost of the apparatus may be increased.

The gap L1 may be, desirably, greater than a thickness of a sheath between plasma generated right below the microwave transmissive plate 28 and the microwave transmissive plate 28 and by way of example, the gap L1 may be, desirably, in a range of from about 10 mm to about 30 mm and more desirably, in a range of from about 20 mm to about 25 mm. When the gap L1 is smaller than about 10 mm, the plasma may not be stabilized. In particular, if the gap L1 is equal to or smaller than the thickness of the sheath, it may be difficult to generate plasma within the processing chamber 1. When the gap L1 is greater than about 30 mm, the extended protrusion 64 may be too close to the electrode 7 in the mounting table 5. Thus, it may be difficult for the extended protrusion 64 to serve as the facing electrode and the extended protrusion 64 may be damaged by heat of the mounting table 5.

Likewise, in order to prevent the extended protrusion 64 from being too close to the electrode 7 in the mounting table 5, it may be desirable that an upper limit of a thickness L2 (i.e. a distance between the upper surface 64a and the lower surface 64c) of the extended protrusion 64 may be, for example, about 20 mm. However, if the thickness L2 of the extended protrusion 64 is too small, an effect of the extended protrusion 64 as the facing electrode may be decreased. Thus, desirably, a lower limit of the thickness L2 may be, for example, about 5 mm. Therefore, the thickness L2 of the extended protrusion 64 may be, desirably, in a range of from about 5 mm to about 20 mm and more desirably, in a range of from about 7 mm to about 17 mm.

A distance L3 from the lower surface 64c of the extended protrusion 64 to the upper surface of the mounting table 5 (herein, a height difference between two components) may be, for example, desirably, in a range of from about 15 mm to about 60 mm and more desirably, in a range of from about 20 mm to about 25 mm in order for the extended protrusion 64 to serve as the facing electrode but not to be too close to the electrode 7 in the mounting table 5.

In the plasma processing apparatus 104 in accordance with the present embodiment, gas inlet openings 15a may be positioned at the contact support 60' above the extended protrusion 64 and a processing gas may be supplied to the space S1 between the extended protrusion 64 and the microwave transmissive plate 28. With this configuration, it may be possible to promote a substitution and a discharge of a gas in the space S1 (which serves as a portion of the plasma generation space S) right below the microwave transmissive plate 28, and the processing gas may be activated easily. Therefore, it may be possible to efficiently generate plasma in the entire space S1 right below the microwave transmissive plate 28. As another effect, by supplying the processing gas into the space S1 right below the microwave transmissive plate 28, it may be possible to promote a discharge of oxygen released from the microwave transmissive plate 28 made of quartz when a plasma nitridation process is performed in the plasma processing apparatus 104. Therefore, it may be possible to suppress a decrease in a concentration of nitrogen contained in a formed nitride film.

Figure 8:
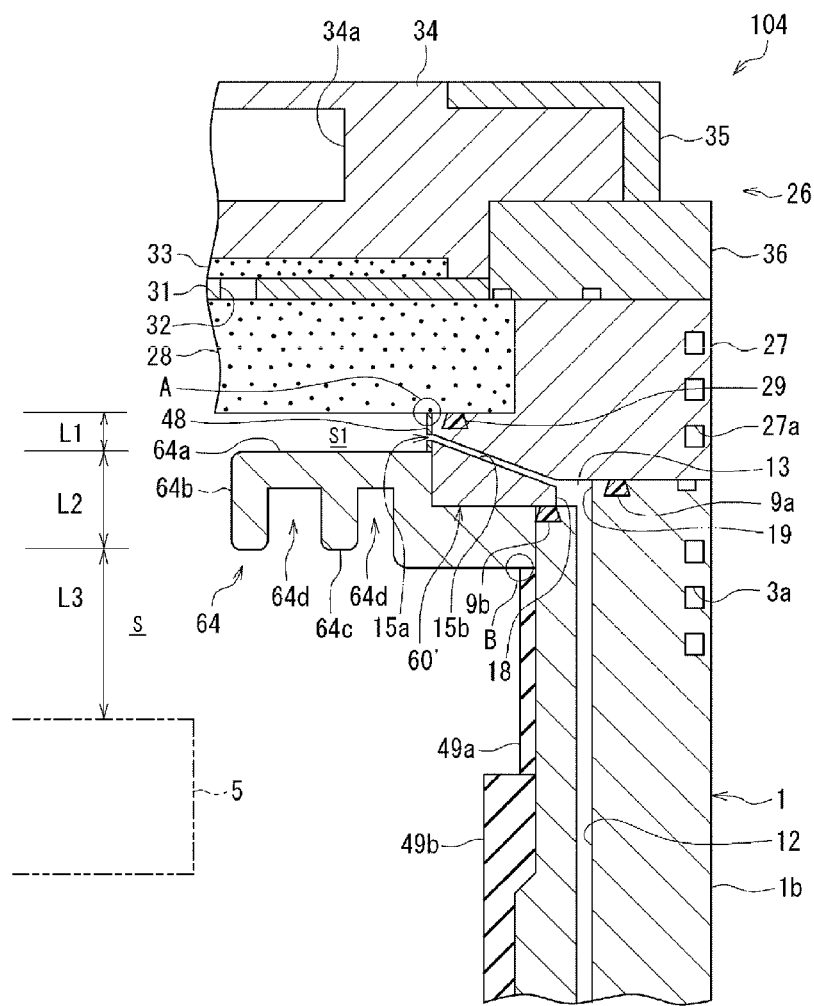
FIG. 8 is a cross sectional view of main parts of a plasma processing apparatus in accordance with a fifth embodiment of the present disclosure.

The extended protrusion 64 shown in FIG. 8 may include the annular double grooves 64d at the lower surface 64c of the extended protrusion 64 in order to secure a sufficient large surface area. However, a cross sectional shape of the extended protrusion 64 may not be limited to the shape as depicted in FIG. 8. In order for the extended protrusion 64 to have a greater surface area, for example, a multiple number of holes may be provided annularly. However, in order to prevent an abnormal electric discharge or generation of particles on the surface of the extended protrusion 64 protruding toward the plasma generation space S, it is desirable that angled portions may be formed in rounded shapes as depicted in FIG. 8. Further, although FIG. 8 shows that the extended protrusion 64 may be in contact with the contact support 60' of the cover member 27, the extended protrusion 64 may be spaced from the contact support 60'.

In the present embodiment, a protective film 48 may be formed on the exposed surface of the contact support 60' facing the plasma generation space S. Meanwhile, the entire extended protrusion 64 may be made of, for example, silicon, and, thus, the protective film may not be formed thereon. However, if the extended protrusion 64 is made of a metal material such as aluminum, the protective film may be formed by, for example, coating the surface of the extended protrusion 64 with a $SiO_2$ film by means of a plasma spraying method. Even if the protective film 48 is formed on the contact support 60' and the extended protrusion 64, the contact support 60' and the extended protrusion 64 can serve as the facing electrode and stable plasma can be generated, so that it may be possible to perform a uniform plasma process.

Other configurations and effects of the present embodiment are the same as those of the first embodiment.

Characteristic configurations explained in the first to fifth embodiments can be combined with each other. By way of example, in the extended protrusion 60B in the first embodiment (FIGS. 1, 2A and 2B) or the extended protrusion in the third embodiment (FIG. 6), prominences and depressions may be additionally formed as described in the second embodiment, so that a surface area thereof may be increased. Likewise, in the extended protrusions 63 and 64 in the fourth embodiment (FIG. 7) and the fifth embodiment (FIG. 8), respectively, prominences and depressions may be additionally formed as described in the second embodiment, so that a surface area thereof may be increased.

Further, a protrusion serving as a facing electrode may be provided at both of the cover member 27 and the processing chamber 1, or auxiliary electrode members (extended protrusions 63 and 64) serving as facing electrodes may be provided at both of the cover member 27 and the processing chamber 1.

Figure 9A:
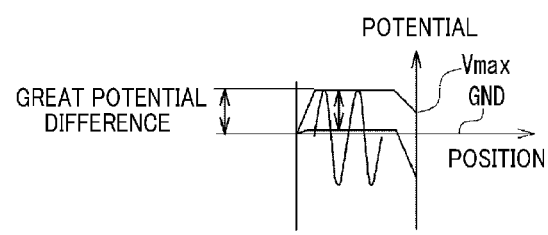
FIG. 9A is an explanatory diagram showing a potential of a mounting table when a high frequency voltage is applied to an electrode in the mounting table in case where a bias electrode has an insufficient area with respect to a surface area of a facing electrode.
Figure 9B:
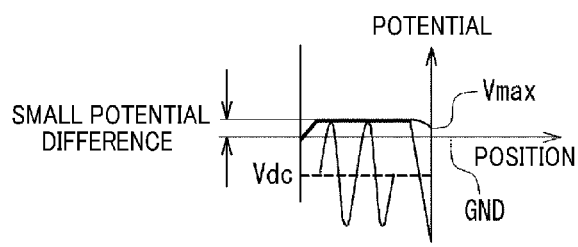
FIG. 9B is an explanatory diagram showing a potential of a mounting table when a high frequency voltage is applied to an electrode in the mounting table in case where a bias electrode has a sufficient area with respect to a surface area of a facing electrode.

Hereinafter, an effect of the present disclosure will be explained with reference to experimental data. In a plasma processing apparatus of the same configuration of the plasma processing apparatus 100 depicted in FIG. 1, if a potential of the mounting table 5 is measured when a high frequency voltage is applied to the electrode 7 in the mounting table 5, AC waveforms are shown as schematically illustrated in FIGS. 9A and 9B. FIG. 9A shows that a facing electrode surface area has an insufficient size with respect to a bias electrode area, and FIG. 9B shows that a facing electrode surface area has a sufficient size with respect to a bias electrode area. In FIGS. 9A and 9B, $V_{max}$ denotes a maximum value of amplitude of the high frequency voltage at the mounting table 5. Generally, a potential difference of $V_{max}$-GND (ground potential) may correspond to oscillation amplitude of a plasma potential Vp. In FIG. 9A showing that the facing electrode surface area has an insufficient size with respect to the bias electrode area, the Vp may oscillate by a high frequency power, so that the $V_{max}$ may be increased. Meanwhile, in FIG. 9B showing that the facing electrode surface area has a sufficient surface size with respect to the bias electrode area, the plasma potential may be rarely changed and a self bias voltage $V_{dc}$ can be generated.

Figure 10:
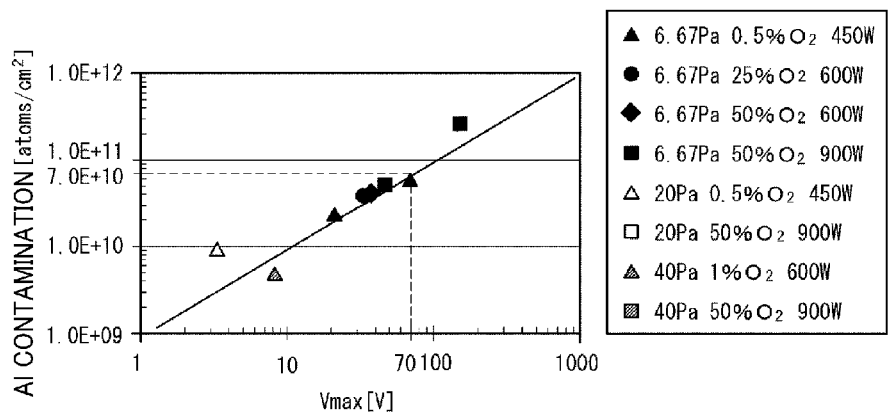
FIG. 10 is a graph showing a relationship between an amount of aluminum (Al) contamination and $V_{max}$ in a plasma oxidation process.

FIG. 10 shows a relationship between $V_{max}$ and an amount of aluminum (Al) contamination generated when a plasma oxidation process is performed in the plasma processing apparatus while changing process conditions. The process conditions may be as follows. A processing pressure may be about 6.67 Pa, about 20 Pa or about 40 Pa. An Ar gas and an $O_2$ gas may be used as a processing gas, and a flow rate ratio of the oxygen gas to the processing gas may be about 0.5 volume %, about 1 volume %, about 25 volume % or about 50 volume %. Further, a frequency of a high frequency bias power supplied to the electrode 7 in the mounting table 5 may be about 13.56 MHz, and a high frequency power may be about 450 W, about 600 W or about 900 W. As can be seen from FIG. 10, regardless of the above process conditions, as the $V_{max}$ is increased, an amount of Al contamination may be increased in proportion thereto. The cause that Al contamination is generated may be that the cover member 27 made of aluminum has been sputtered. In order to suppress the Al contamination, it may be effective to reduce a value of the $V_{max}$. By way of example, in order to suppress the Al contamination to be about $7 \times 10^{10}$ [atoms/cm$^2$] or less, the $V_{max}$ needs to be about 70 V or less. Further, in order to suppress the $V_{max}$, as depicted in FIG. 9B, it may be effective to make the facing electrode surface area greater than the bias electrode area.

An experiment has been conducted to measure a change in $V_{max}$ when a facing electrode surface area is varied while a bias electrode area is fixed. FIGS. 11 to 16 are graphs each showing a relationship between a facing electrode area ratio (horizontal axis) and $V_{max}$ (longitudinal axis) when a plasma oxidation process is performed under various process conditions by a plasma processing apparatus of the same configuration of the plasma processing apparatus 100 depicted in FIG. 1. Herein, the facing electrode area ratio means a value obtained by dividing the facing electrode surface area by the bias electrode area. Further, an Ar gas and an oxygen gas may be used as a processing gas. Furthermore, a frequency of a high frequency bias power supplied to the electrode 7 in the mounting table 5 may be about 13.56 MHz, and a high frequency power may be about 0 W (power not applied), about 300 W, about 450 W, about 600 W or about 900 W.

Figure 11:
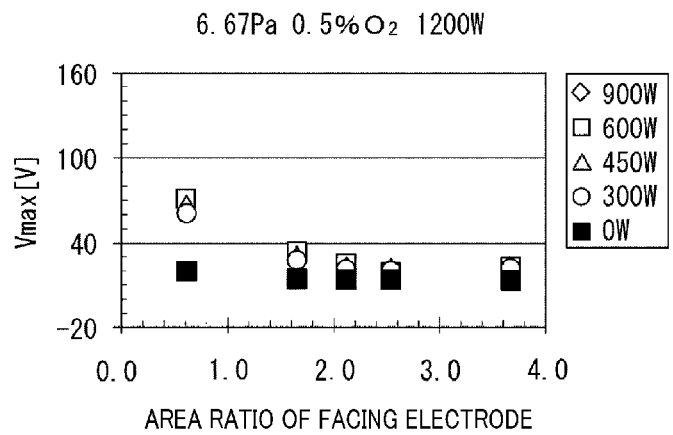
FIG. 11 is a graph showing a relationship between a facing electrode area ratio (horizontal axis) and $V_{max}$ (longitudinal axis) in a plasma oxidation process.
Figure 12:
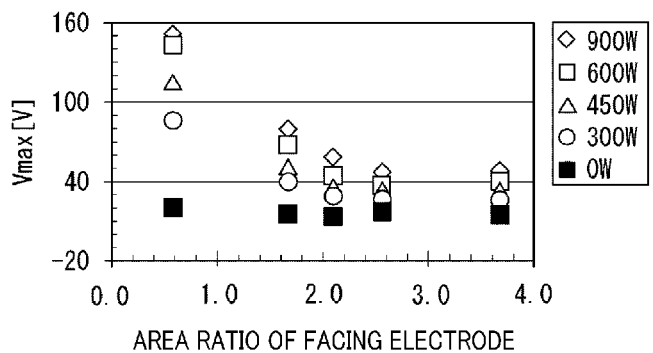
FIG. 12 is a graph showing a relationship between a facing electrode area ratio (horizontal axis) and $V_{max}$ (longitudinal axis) in a plasma oxidation process under another condition.
Figure 13:
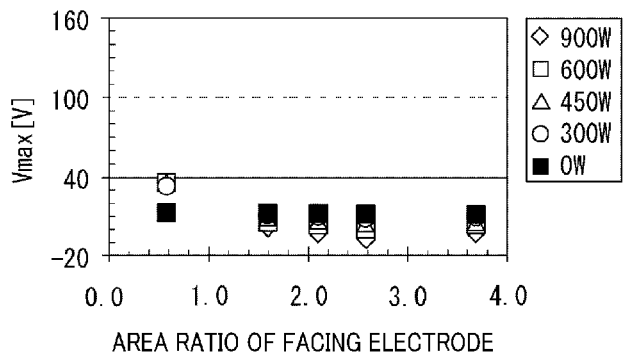
FIG. 13 is a graph showing a relationship between a facing electrode area ratio (horizontal axis) and $V_{max}$ (longitudinal axis) in a plasma oxidation process under still another condition.
Figure 14:
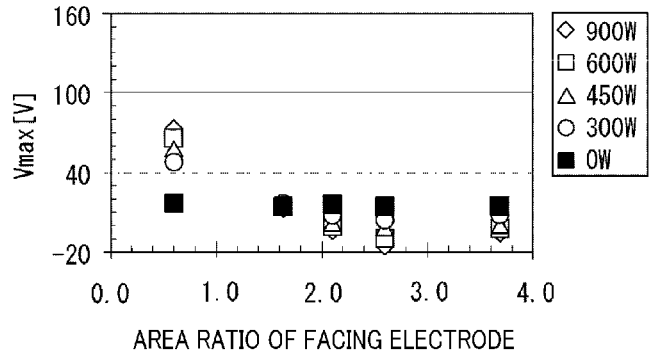
FIG. 14 is a graph showing a relationship between a facing electrode area ratio (horizontal axis) and $V_{max}$ (longitudinal axis) in a plasma oxidation process under still another condition.
Figure 15:
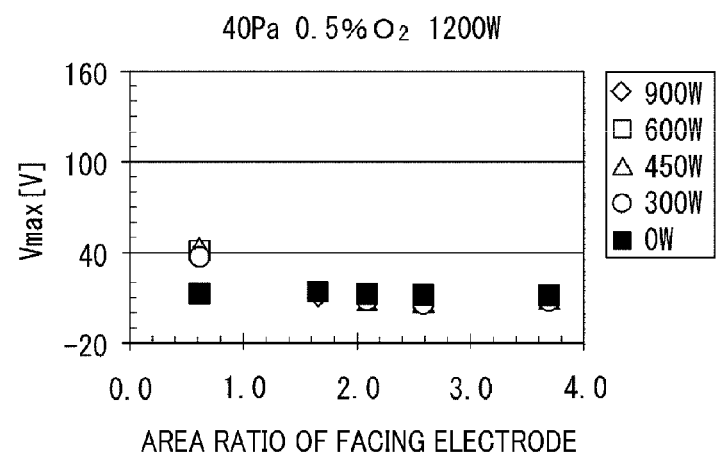
FIG. 15 is a graph showing a relationship between a facing electrode area ratio (horizontal axis) and $V_{max}$ (longitudinal axis) in a plasma oxidation process under still another condition.
Figure 16:
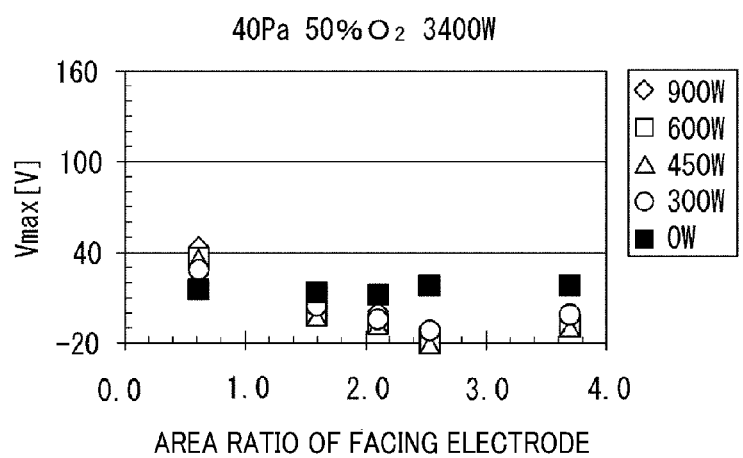
FIG. 16 is a graph showing a relationship between a facing electrode area ratio (horizontal axis) and $V_{max}$ (longitudinal axis) in a plasma oxidation process under still another condition.

FIG. 11 shows experimental data under conditions set at about 6.67 Pa for a processing pressure, about 0.5 volume % for a flow rate ratio of an oxygen gas, and about 1200 W for a microwave power for generating plasma. FIG. 12 shows experimental data under conditions set at about 6.67 Pa for a processing pressure, about 50 volume % for a flow rate ratio of an oxygen gas, and about 3400 W for a microwave power for generating plasma. FIG. 13 shows experimental data under conditions set at about 20 Pa for a processing pressure, about 0.5 volume % for a flow rate ratio of an oxygen gas, and about 1200 W for a microwave power for generating plasma. FIG. 14 shows experimental data under conditions set at about 20 Pa for a processing pressure, about 50 volume % for a flow rate ratio of an oxygen gas, and about 3400 W for a microwave power for generating plasma. FIG. 15 shows experimental data under conditions set at about 40 Pa for a processing pressure, about 0.5 volume % for a flow rate ratio of an oxygen gas, and about 1200 W for a microwave power for generating plasma. FIG. 16 shows experimental data under conditions set at about 40 Pa for a processing pressure, about 50 volume % for a flow rate ratio of an oxygen gas, and about 3400 W for a microwave power for generating plasma. The facing electrode surface area may be about 500 cm$^2$, 1400 cm$^2$, 1800 cm$^2$, 2200 cm$^2$, or 3150 cm$^2$, and the bias electrode area may be set to about 855 cm$^2$.

It can be seen from the graphs of FIGS. 11 to 16 that as the facing electrode area ratio is increased, the $V_{max}$ may be decreased. Further, this tendency may be remarkable under the processing pressure of about 6.67 Pa. It has been found that an effect of suppressing the $V_{max}$ with an increase of the facing electrode area ratio can be achieved as the pressure becomes low. In the plasma processing apparatus of the same configuration of the plasma processing apparatus 100 depicted in FIG. 1, in order to surely obtain the effect of suppressing the $V_{max}$ with the increase of the facing electrode area ratio, it may be desirable to perform a plasma process under the processing pressure of about 40 Pa or less.

Figure 17:
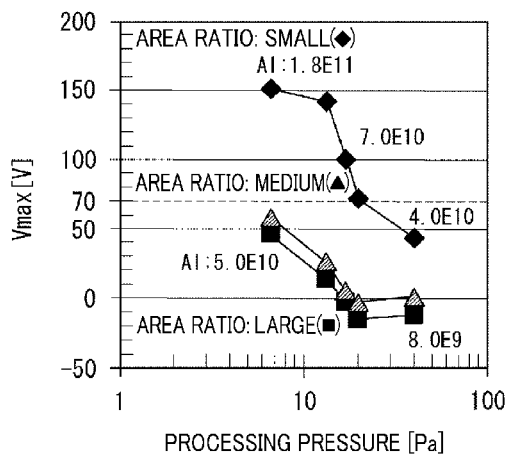
FIG. 17 is a graph showing $V_{max}$ (longitudinal axis) and an amount of aluminum (Al) contamination when a plasma oxidation process is performed by changing a processing pressure and a facing electrode area ratio.

Based on the foregoing results, in a plasma processing apparatus of the same configuration of the plasma processing apparatus 100 depicted in FIG. 1, an amount of aluminum (Al) contamination generated when a plasma oxidation process may be performed while changing a facing electrode surface area has been examined. In this experiment, a facing electrode surface area may be set to about 2200 cm$^2$ (area ratio: large), about 1800 cm$^2$ (area ratio: medium) or about 500 cm$^2$ (area ratio: small), and a bias electrode area may be set to about 855 cm$^2$. Further, a processing pressure may vary in a range of from about 6.67 Pa to about 40 Pa. FIG. 17 shows the experimental results. In FIG. 17, numerals of "5.0 E10" and "1.8 E11" represent amounts of Al contamination of "$5.0 \times 10^{10}$" and "$1.8 \times 10^{11}$", respectively. Based on the results, when the facing electrode surface area is 2200 cm$^2$ (area ratio: large) or about 1800 cm$^2$ (area ratio: medium), the $V_{max}$ can be suppressed to be about 70 V or less under the processing pressure of about 40 Pa or less (see FIG. 10). Thus, the Al contamination can be suppressed sufficiently. However, when the facing electrode surface area is about 500 cm$^2$ (area ratio: small), the $V_{max}$ cannot be suppressed to be about 70 V or less under the processing pressure of about 20 Pa or less (see FIG. 10). Thus, the amount of Al contamination may be greatly increased. Accordingly, in order to suppress the $V_{max}$ to be about 70 V or less, it may be effective to set the facing electrode surface area to be about 1800 cm$^2$ (area ratio: medium) or more. Therefore, it has been found that the facing electrode area ratio (the facing electrode surface area/the bias electrode area) may be, desirably, in a range of from about 1 to about 5 and, more desirably, in a range of from about 2 to about 5 and still more desirably, in a range of from about 2 to about 4.

Then, an experiment has been conducted to verify an effect of a difference in an inlet position of a processing gas in a plasma processing apparatus of the same configuration of the plasma processing apparatus 100 depicted in FIG. 1. In this experiment, during a plasma nitridation process, there has been made a comparison of an amount of oxygen in a silicon nitride film when the following two cases. That is, the first case is when a processing gas is introduced through the gas inlet openings 15*a* depicted in FIG. 1 (embodiment as illustrated in FIG. 1), and the second case is when a gas ring is provided annularly at the sidewall 1*b* below the protrusion 60 and a processing gas is introduced (comparative example not illustrated). A processing target in the plasma nitridation process is silicon on a surface of a wafer W having a diameter of about 300 mm. An amount of oxygen in the silicon nitride film has been measured at a central area and a periphery of the wafer W by an X-ray photoelectron spectroscopy (XPS) apparatus.

Conditions of the plasma nitridation process are as follows, and a flow rate ratio of $N_2$, a processing pressure and a high frequency bias power are varied.

Figure 18A:
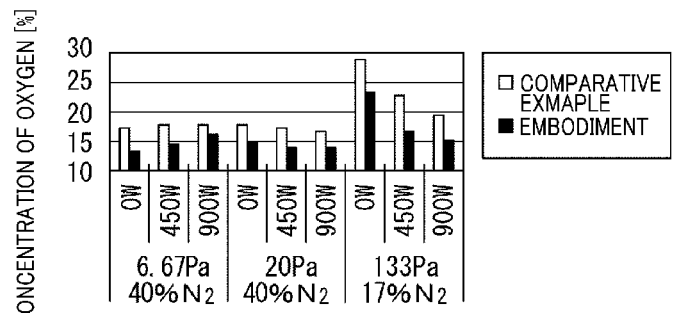
FIG. 18A is a graph showing a measurement result of an oxygen amount at a central portion of a wafer in a plasma nitridation process.
Figure 18B:
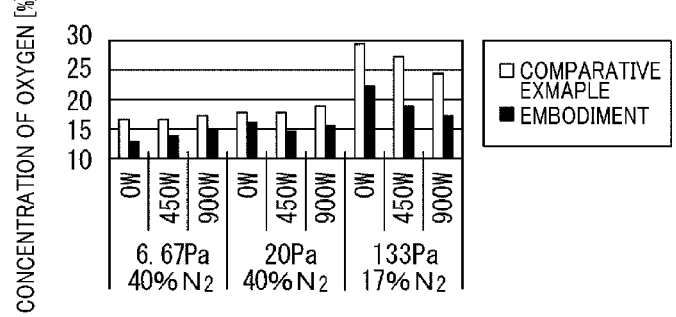
FIG. 18B is a graph showing a measurement result of an oxygen amount at an edge portion of a wafer in a plasma nitridation process.

<$N_2$ flow rate ratio: 17%>
$N_2$ flow rate: 333 mL/min (sccm), Ar flow rate: 1667 mL/min (sccm)<
<$N_2$ flow rate ratio: 40%>
$N_2$ flow rate: 800 mL/min (sccm), Ar flow rate: 1200 mL/min (sccm)
Processing pressure: 6.67 Pa, 20 Pa, or 133 Pa
Microwave power: 1500 W
High frequency bias power: 0 W (power not applied), 450 W, or 900 W
Processing time: 90 seconds FIG. 18A shows a measurement result of an amount of oxygen in the silicon nitride film at the central area of the wafer W, and FIG. 18B shows a measurement result of an amount of oxygen in the silicon nitride film at the periphery of the wafer W. In an experimental example of introducing the processing gas from the gas inlet openings 15*a*, it can be seen that a concentration of oxygen in the silicon nitride film is decreased under the processing pressure in a range of from about 6.67 Pa to about 133 Pa as compared with the comparative example of introducing the processing gas from a position below the protrusion 60. In the experimental example, the concentration of oxygen may be decreased regardless of whether or not a high frequency bias power is applied, and the same tendency can be seen at the central area and the periphery of the wafer W. According to the measurement results at the periphery, where the concentration of oxygen is high, of the wafer W under the processing pressure of about 133 Pa, a decrease of about 80 at most in the concentration of oxygen can be found in the experimental example as compared with the comparative example.

In a plasma processing apparatus, having the extended protrusion 60B in order to increase the facing electrode area, of the same configuration as depicted in FIG. 1, the closed space S1 between the extended protrusion 60B and the microwave transmissive plate 28 may serve as a gas reservoir. As a result, the gas reservoir may easily cause an oxygen entrance into the silicon nitride film during the plasma nitridation process. The oxygen entrance means that oxygen existing in the microwave transmissive plate 28 is released to the plasma generation space S by plasma, and then, the released oxygen may enter into the silicon nitride film formed during the plasma nitridation process. In the comparative example, the processing gas is introduced from the position below the protrusion 60, and, thus, the gas may stay in the space S1 right below the microwave transmissive plate 28. Accordingly, the oxygen released from the microwave transmissive plate 28 may stay in the space S1 for a long time and it may be difficult for the oxygen to be discharged from the processing chamber 1. As a result, there is a strong probability that the oxygen enters into the silicon nitride film on the surface of the wafer W. Meanwhile, in the experimental example, the processing gas is introduced from the gas inlet openings 15a into the space S1 right below the microwave transmissive plate 28. Thus, the oxygen released from the microwave transmissive plate 28 can be quickly moved from the space S1. Accordingly, since the oxygen can be efficiently discharged to the outside of the processing chamber 1, it may be possible that the oxygen does not easily enter into the silicon nitride film on the wafer W.

As described above, plasma processing apparatuses in respective embodiments of the present disclosure may include extended protrusions 60B, 61B, 62, 63 and 64 protruding from the processing chamber 1 or the cover member 27 toward the plasma generation space S with the gap L1 with respect to the microwave transmissive plate 28. Further, the extended protrusions 60B, 61B, 62, 63 and 64 may serve as a part of a facing electrode facing the electrode 7 with a plasma generation space S therebetween. Thus, the facing electrode may have a sufficiently large area and oscillation of the plasma potential Vp can be suppressed. Furthermore, by increasing the facing electrode surface area, it may be possible to suppress sputtering on the surface of the facing electrode by plasma, and, thus, contamination can be prevented. Furthermore, since the facing electrode may have a sufficiently large area, a short circuit or an abnormal electric discharge in other portions can be suppressed. Moreover, since the extended protrusion 60B, 61B, 62, 63 and 64 may be spaced from the microwave transmissive plate 28, it is not necessary to reduce an effective area of the microwave transmissive plate 28, and plasma generated within the processing chamber 1 can be stabilized by introducing a sufficient microwave power.

The embodiments of the present disclosure have been provided for the examples in detail, but the present disclosure is not limited to the above-described embodiments. By way of example, in the above-described embodiments, the cover member 27 for supporting the microwave transmissive plate 28 is a part of the microwave inlet unit 26, but the cover member 27 for supporting the microwave transmissive plate 28 may be a part of the processing chamber 1.

Figure 19:
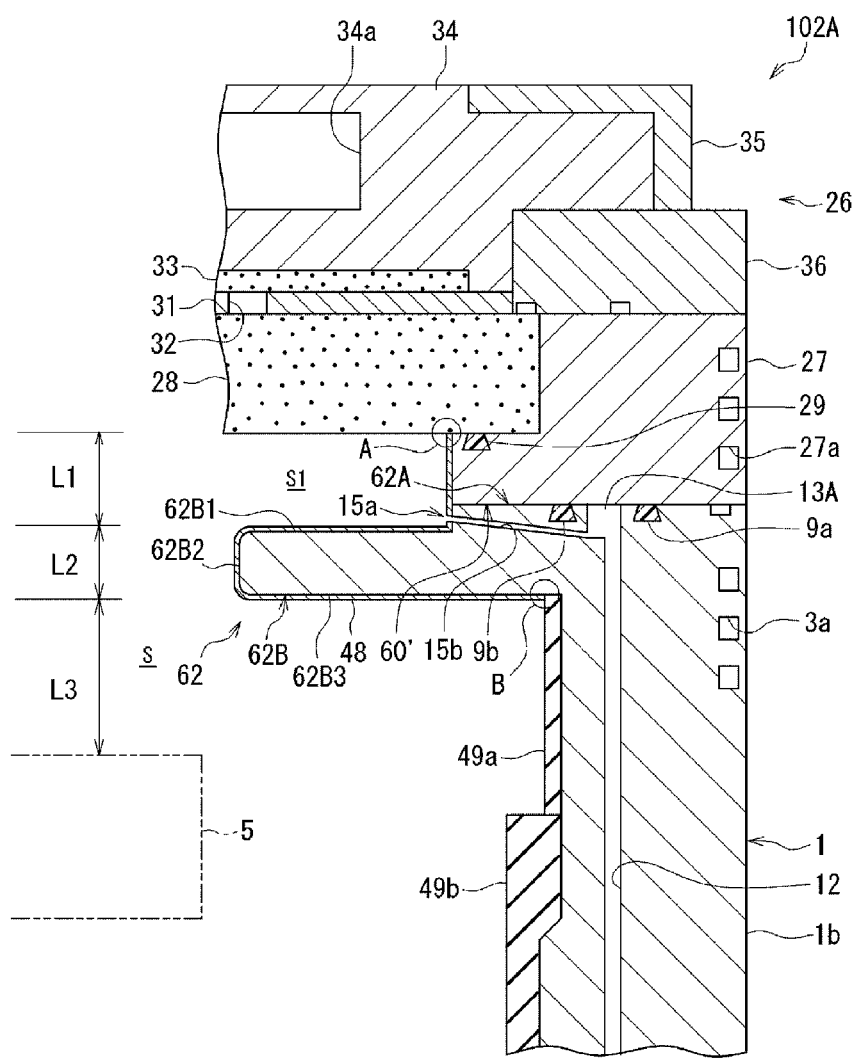
FIG. 19 is a cross sectional view of main parts of a plasma processing apparatus in a modification example of the third embodiment of the present disclosure.

Further, in the above-described embodiments, the gas inlet openings 15a are provided at the cover member 27, but the gas inlet openings 15a may be provided at other members other than the cover member 27. By way of example, FIG. 19 is a cross sectional view of main parts of a configuration of a plasma processing apparatus 102A in a modification example of an aspect (the third embodiment; see FIG. 6) in which an extended protrusion 62 is provided as a single body with the sidewall 1b of the processing chamber 1. As depicted in FIG. 19, the rectangularly annular path 13A may be provided at the upper end of the sidewall 1b of the processing chamber 1, and the gas inlet path 15b communicating with this annular path 13A may be formed in the sidewall 1b. Therefore, the gas inlet openings 15a may be provided at the upper portion of the sidewall 1b. With this configuration, a processing gas can be supplied from the gas inlet openings 15a to the space S1 between the microwave transmissive plate 28 and the extended protrusion 62.

Further, in the above-described embodiments, a main body of the cover member 27 serving as a member to be exposed to plasma is made of aluminum. However, even if the cover member 27 is made of other metal such as stainless steel, the same effect can be obtained.

A shape of the extended protrusion is not limited to an annular shape, and multiple extended protrusions separated from each other may be provided so as to protrude toward the plasma generation space S.

The plasma process is not limited to the plasma oxidation process or the plasma nitridation process if the high frequency power is supplied to the electrode 7 in the mounting table 5. By way of example, various plasma processes such as a plasma CVD process, an etching process or the like can be employed. Further, the target object is not limited to the semiconductor wafer, and other substrates such as a FPD glass substrate or the like can be employed.

What is claimed is:

1. A plasma processing apparatus comprising:
a processing chamber having an opening at an upper portion thereof and configured to perform therein a process on a target object by plasma;
a mounting table configured to mount the target object thereon within the processing chamber;
a first electrode embedded in the mounting table and configured to apply a bias voltage to the target object;
a dielectric plate configured to form a plasma generation space by closing the opening of the processing chamber and transmit a microwave so as to introduce the microwave into the processing chamber;
a planar antenna having multiple slot holes provided above the dielectric plate and configured to introduce the microwave generated by a microwave generator into the processing chamber via the dielectric plate;
an annular cover member provided on the processing chamber and including a contact support protruding toward the plasma generation space and configured to support an outer periphery of the dielectric plate on an upper surface of the contact support;
an annular extended protrusion that is different from a gas inlet, protruding from the processing chamber or the contact support toward the plasma generation space within the processing chamber with a gap between the dielectric plate and the annular extended protrusion and serving as a part of a second electrode facing the first electrode via the plasma generation space therebetween; and
a space formed between an upper surface of the extended protrusion and a lower surface of the dielectric plate; and
a gas inlet configured to introduce a processing gas toward the space between the dielectric plate and the extended protrusion,
wherein the gas inlet is formed in an inner peripheral surface of the contact support and disposed between the contact support and the extended protrusion.

2. The plasma processing apparatus of claim 1, wherein a gap between the upper surface of the extended protrusion and the lower surface of the dielectric plate is in a range of from about 10 mm to about 30 mm.

3. The plasma processing apparatus of claim 1, wherein a leading end of the extended protrusion has a protruded length that does not reach an area above an edge of the target object mounted on the mounting table.

4. The plasma processing apparatus of claim 1,
wherein the extended protrusion is formed as a single body with the cover member.

5. The plasma processing apparatus of claim 1,
wherein the extended protrusion is formed as a single body with the processing chamber.

6. The plasma processing apparatus of claim 1,
wherein the extended protrusion is an auxiliary electrode fixed to the cover member.

7. The plasma processing apparatus of claim 1,
wherein the extended protrusion is an auxiliary electrode fixed to the processing chamber.

8. The plasma processing apparatus of claim 1,
wherein a surface of the extended protrusion has prominences and depressions.

9. The plasma processing apparatus of claim 1,
wherein a ratio of a surface area of the second electrode facing the plasma generation space to an area of an embedded range of the first electrode in the mounting table is in a range of from about 1 to about 5.

10. The plasma processing apparatus of claim 1, wherein a protective film is formed on the surface of the extended protrusion.

11. The plasma processing apparatus of claim 10,
wherein the protective film is made of silicon.

12. The plasma processing apparatus of claim 1, further comprising:
an insulating plate provided along an inner wall of the processing chamber at a position lower than a mounting surface of the mounting table.

13. The plasma processing apparatus of claim 12,
wherein the insulating plate is provided to reach an exhaust chamber connected to a lower area of the processing chamber.

14. A plasma processing method for performing a process on a target object with plasma by a plasma processing apparatus including: a processing chamber having an opening at an upper portion thereof and configured to perform therein the process on the target object by the plasma; a mounting table configured to mount the target object thereon within the processing chamber; a first electrode embedded in the mounting table and configured to apply a bias voltage to the target object; a dielectric plate configured to form a plasma generation space by closing the opening of the processing chamber and transmit a microwave so as to introduce the microwave into the processing chamber; a planar antenna provided above the dielectric plate and having multiple slot holes, configured to introduce the microwave generated by a microwave generator into the processing chamber via the dielectric plate; an annular cover member provided on the processing chamber and including a contact support protruding toward the plasma generation space and configured to support an outer periphery of the dielectric plate on an upper surface of the contact support; an annular extended protrusion that is different from a gas inlet, protruding from the processing chamber or the contact support toward the plasma generation space within the processing chamber with a gap between the dielectric plate and the annular extended protrusion and serving as a part of a second electrode facing the first electrode via the plasma generation space therebetween; a space formed between an upper surface of the extended protrusion and a lower surface of the dielectric plate; and a gas inlet formed in an inner peripheral surface of the contact support and disposed, between the contact support and the extended protrusion, the method comprising:
introducing a processing gas toward the space between the dielectric plate and the extended protrusion through the gas inlet;
generating the plasma in the processing chamber; and
performing the process on the target object with the generated plasma by the plasma processing apparatus.

15. The plasma processing method of claim 14,
wherein a processing pressure is about 40 Pa or less.

* * * * *

UNITED STATES PATENT AND TRADEMARK OFFICE
CERTIFICATE OF CORRECTION

PATENT NO. : 8,852,389 B2  
APPLICATION NO. : 13/233082  
DATED : October 7, 2014  
INVENTOR(S) : Taichi Monden et al.

Page 1 of 1

It is certified that error appears in the above-identified patent and that said Letters Patent is hereby corrected as shown below:

In the Specification,

Column 9, line 19, please add -- 32 -- between "holes" and "is"

Column 11, line 31, please add -- 7 -- between "electrode" and "(first"

Column 12, line 43, please add -- 5 -- between "table" and "indicates"

Column 15, line 46, please add -- 48 -- between "film" and "of"

Column 31, line 61, please add -- 62 -- between "protrusion" and "in"

Column 34, line 56, please replace "80" with -- 8% --

Signed and Sealed this  
Twenty-fourth Day of February, 2015

Michelle K. Lee  
*Deputy Director of the United States Patent and Trademark Office*